United States Patent
Ryu et al.

(10) Patent No.: US 11,676,902 B2
(45) Date of Patent: Jun. 13, 2023

(54) SEMICONDUCTOR PACKAGE INCLUDING INTERPOSER

(71) Applicant: Samsung Electronics Co., Ltd., Suwon-si (KR)

(72) Inventors: Seung-kwan Ryu, Seongnam-si (KR); Yun-seok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/573,421

(22) Filed: Jan. 11, 2022

(65) Prior Publication Data

US 2022/0130767 A1    Apr. 28, 2022

Related U.S. Application Data

(63) Continuation of application No. 16/556,538, filed on Aug. 30, 2019, now Pat. No. 11,244,904.

(30) Foreign Application Priority Data

Nov. 23, 2018   (KR) .................... 10-2018-0146762

(51) Int. Cl.
  *H01L 23/538* (2006.01)
  *H01L 21/56* (2006.01)
  *H01L 23/00* (2006.01)

(52) U.S. Cl.
  CPC ........ *H01L 23/5384* (2013.01); *H01L 21/568* (2013.01); *H01L 23/5383* (2013.01); *H01L 24/19* (2013.01)

(58) Field of Classification Search
  None
  See application file for complete search history.

(56) References Cited

U.S. PATENT DOCUMENTS

| 8,441,809 B2 | 5/2013 | Mahajan et al. |
| 9,136,236 B2 | 9/2015 | Starkston et al. |

(Continued)

OTHER PUBLICATIONS

Office Action dated Apr. 10, 2023 for corresponding KR Patent Application No. 10-2018-0146762.

*Primary Examiner* — Daniel Whalen
(74) *Attorney, Agent, or Firm* — Muir Patent Law, PLLC

(57) ABSTRACT

A semiconductor package includes a base package substrate, a first semiconductor chip, and a second semiconductor chip. The base package substrate includes a redistribution region where a redistribution layer is provided, a plurality of vertical conductive vias connected to the redistribution layer, and a recess region recessed from an upper surface of the redistribution region. The base package substrate further includes an interposer in the recess region, the interposer comprising a substrate, a plurality of upper pads disposed at an upper surface of the substrate, and plurality of through electrodes respectively connected to the plurality of upper pads to pass through the substrate. The first semiconductor chip and second semiconductor chip, each include a plurality of conductive interconnection terminals respectively connected to the plurality of upper pads and the vertical conductive vias exposed at the upper surface of the redistribution region. The first semiconductor chip and the second semiconductor chip are mounted on the extension region and the interposer and disposed horizontally apart from each other. As seen from a plan view, the interposer is disposed to overlap a portion of each of the first semiconductor chip and the second semiconductor chip.

20 Claims, 21 Drawing Sheets

(56) References Cited

U.S. PATENT DOCUMENTS

| | | |
|---|---|---|
| 9,418,965 B1 | 8/2016 | Li et al. |
| 9,570,324 B2 | 2/2017 | Wu et al. |
| 2006/0226527 A1 | 10/2006 | Hatano et al. |
| 2015/0116965 A1* | 4/2015 | Kim .................... H01L 23/5385 361/767 |
| 2017/0062383 A1 | 3/2017 | Yee et al. |
| 2017/0179078 A1 | 6/2017 | Jung et al. |
| 2017/0207168 A1 | 7/2017 | Liu et al. |
| 2017/0301625 A1 | 10/2017 | Mahajan et al. |
| 2018/0102298 A1* | 4/2018 | Chen .................... H01L 23/5384 |
| 2018/0102311 A1* | 4/2018 | Shih .................. H01L 23/49827 |

\* cited by examiner

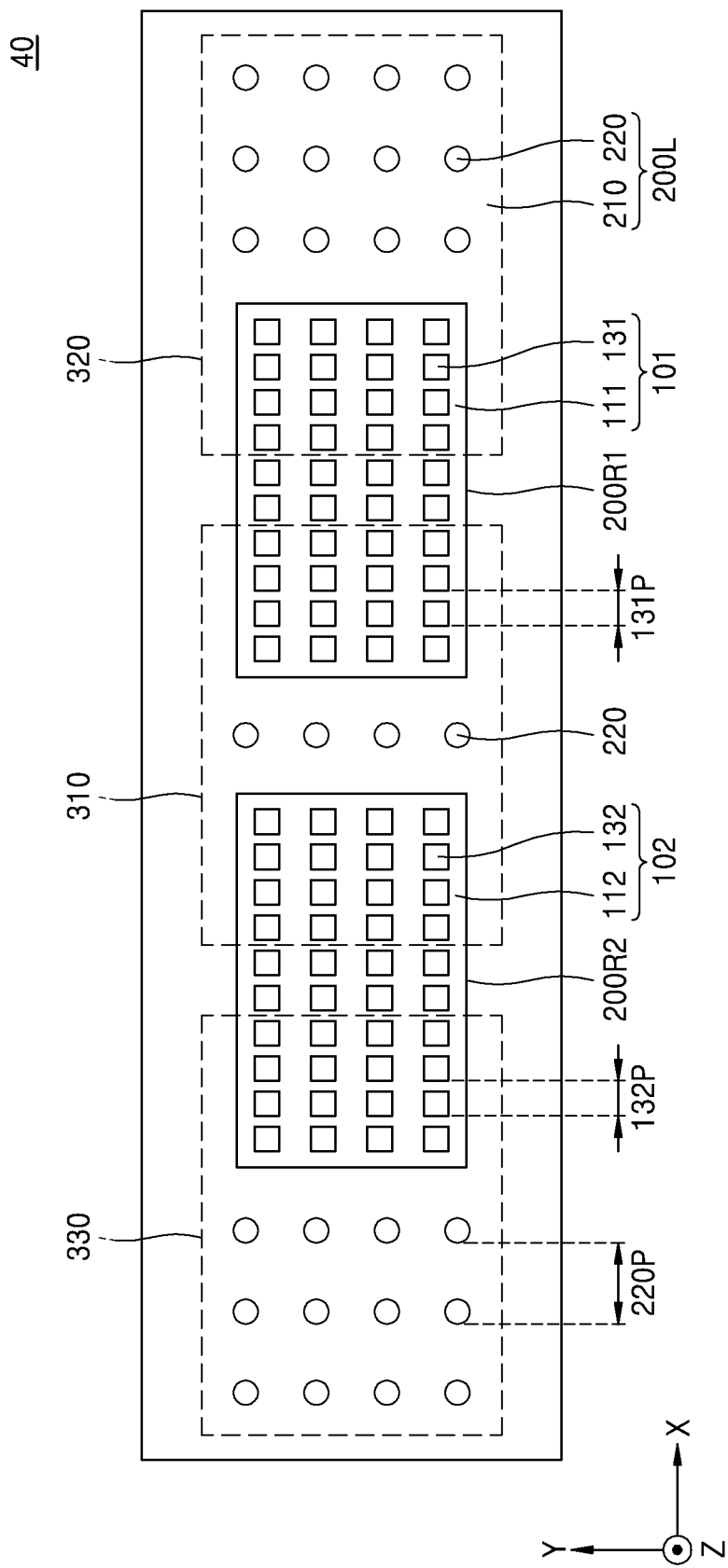

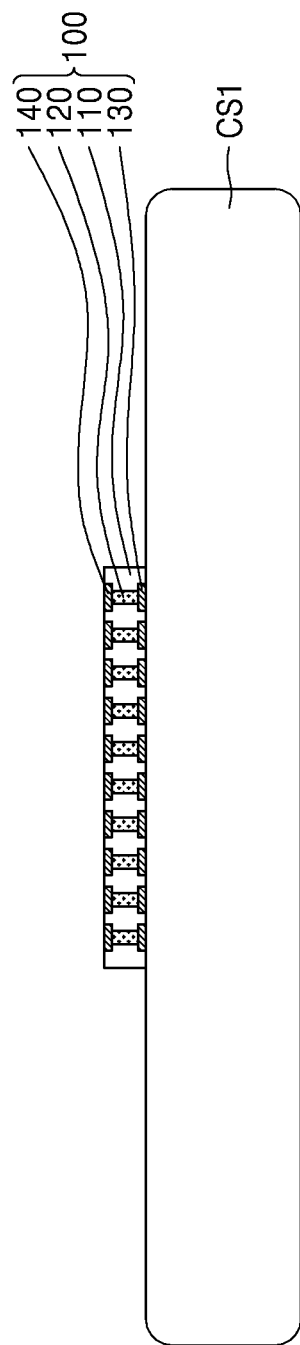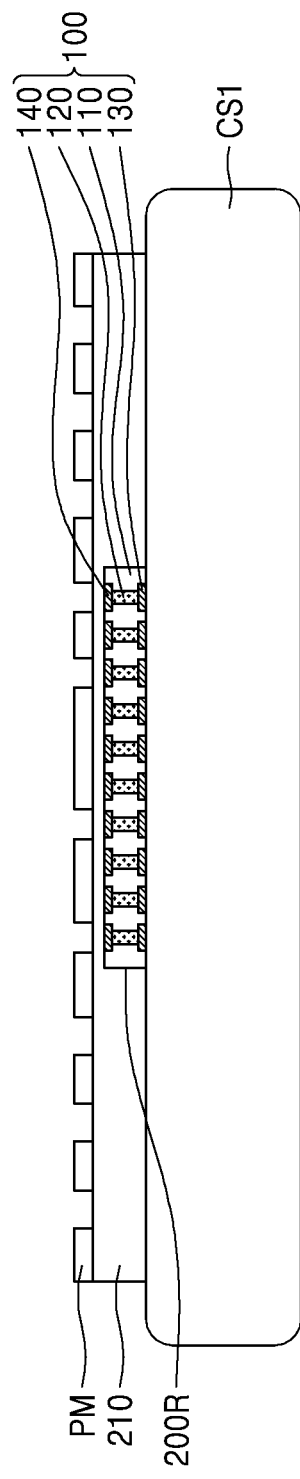

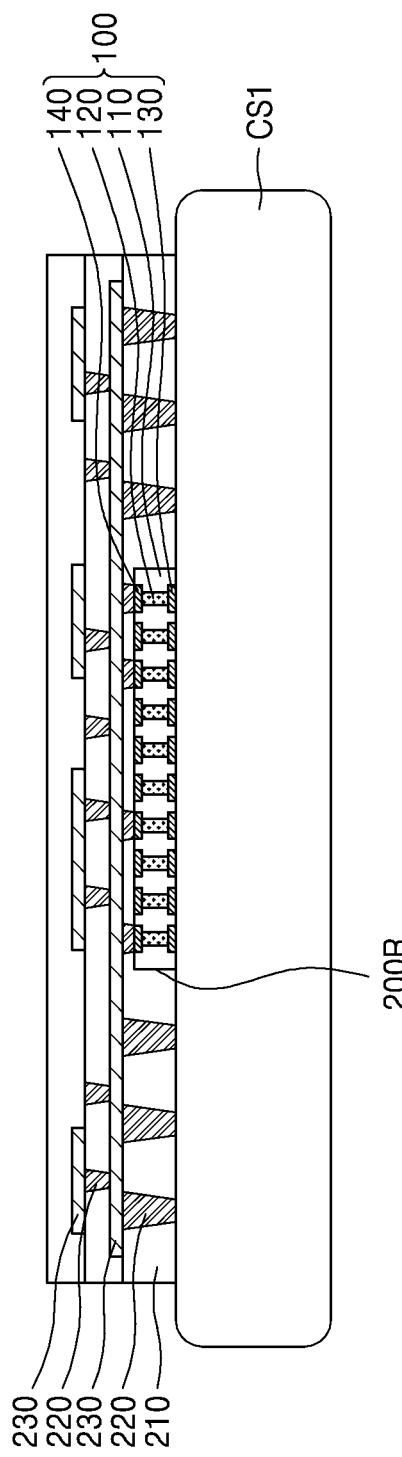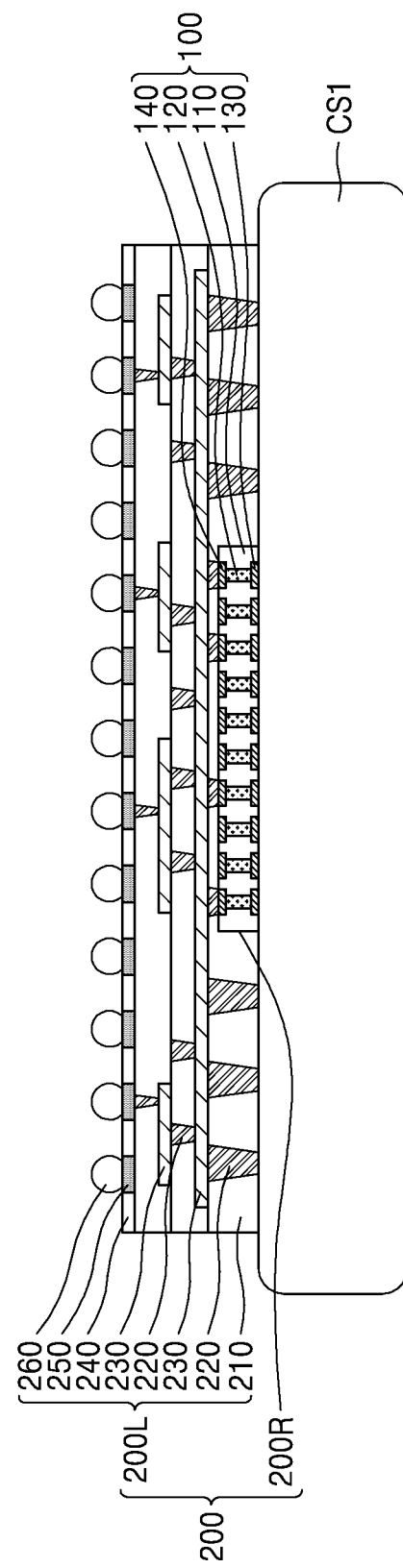

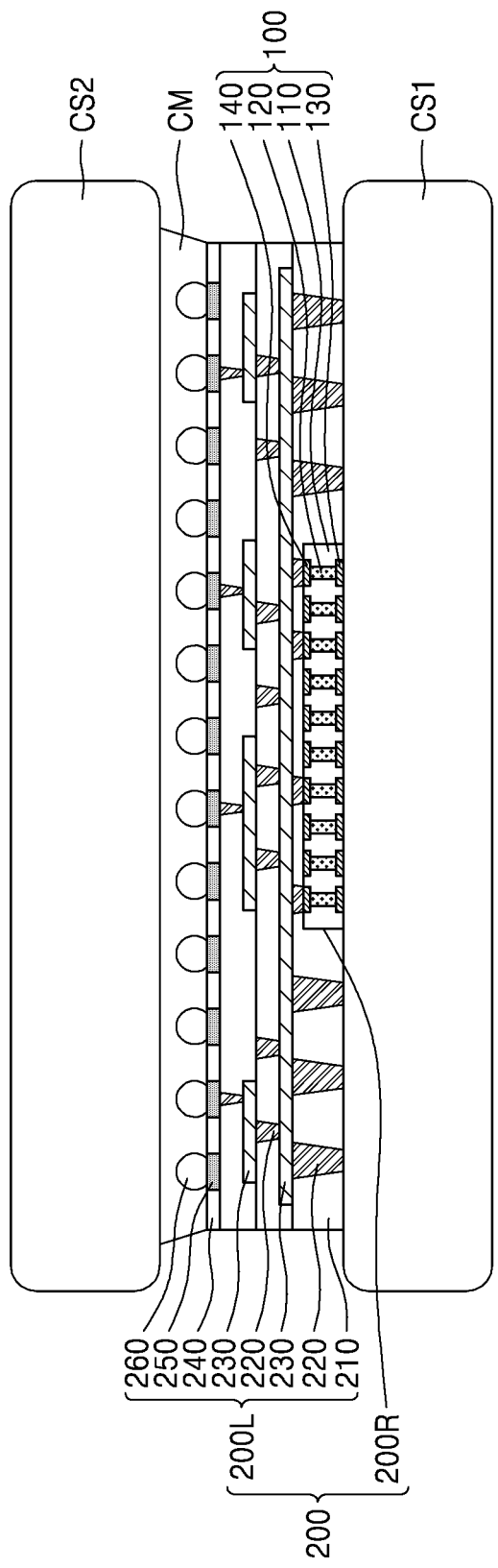
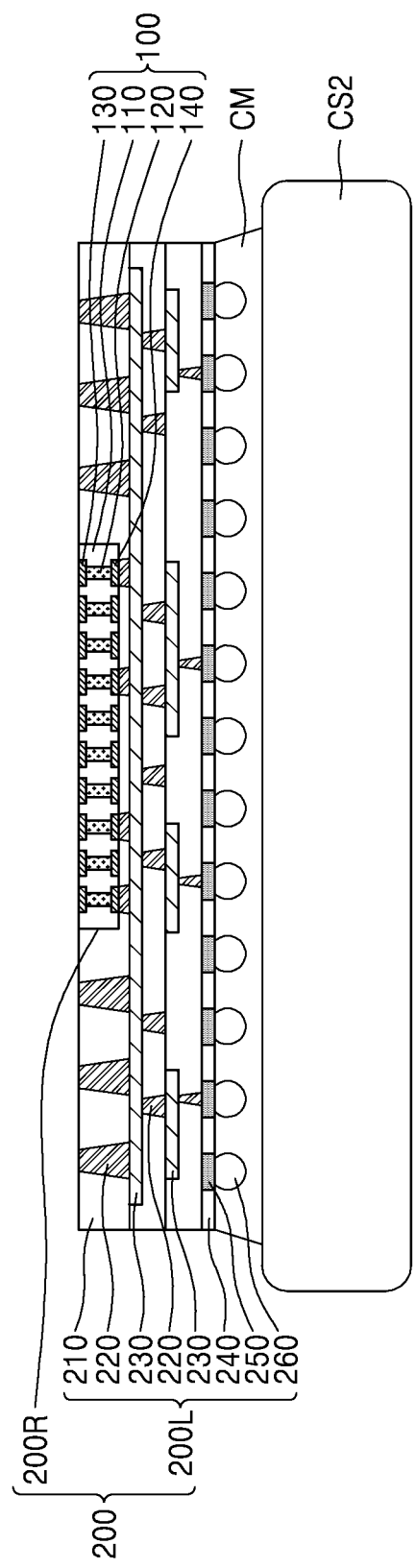

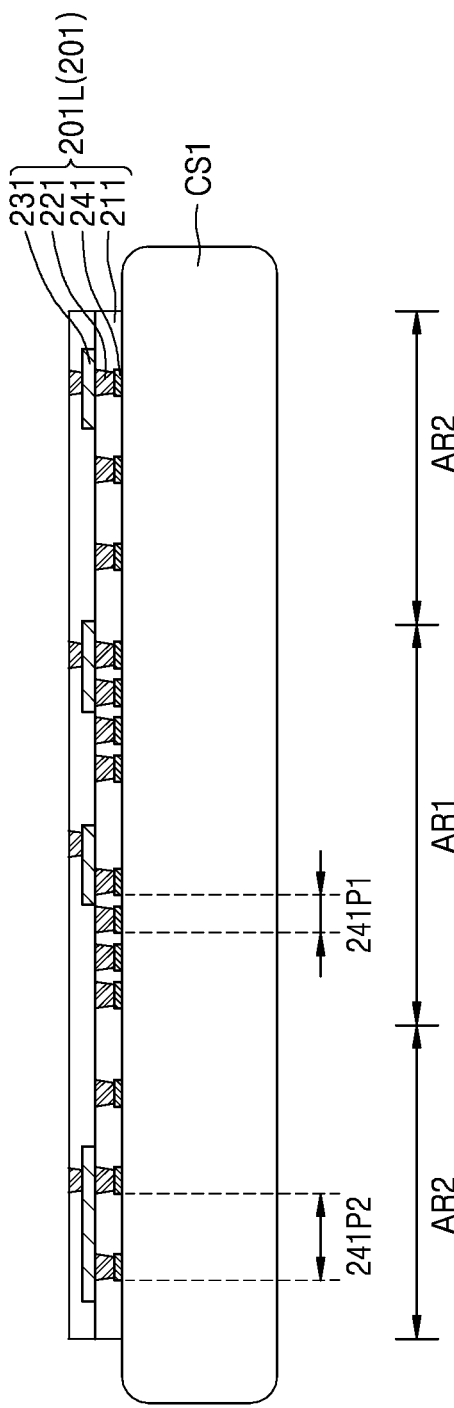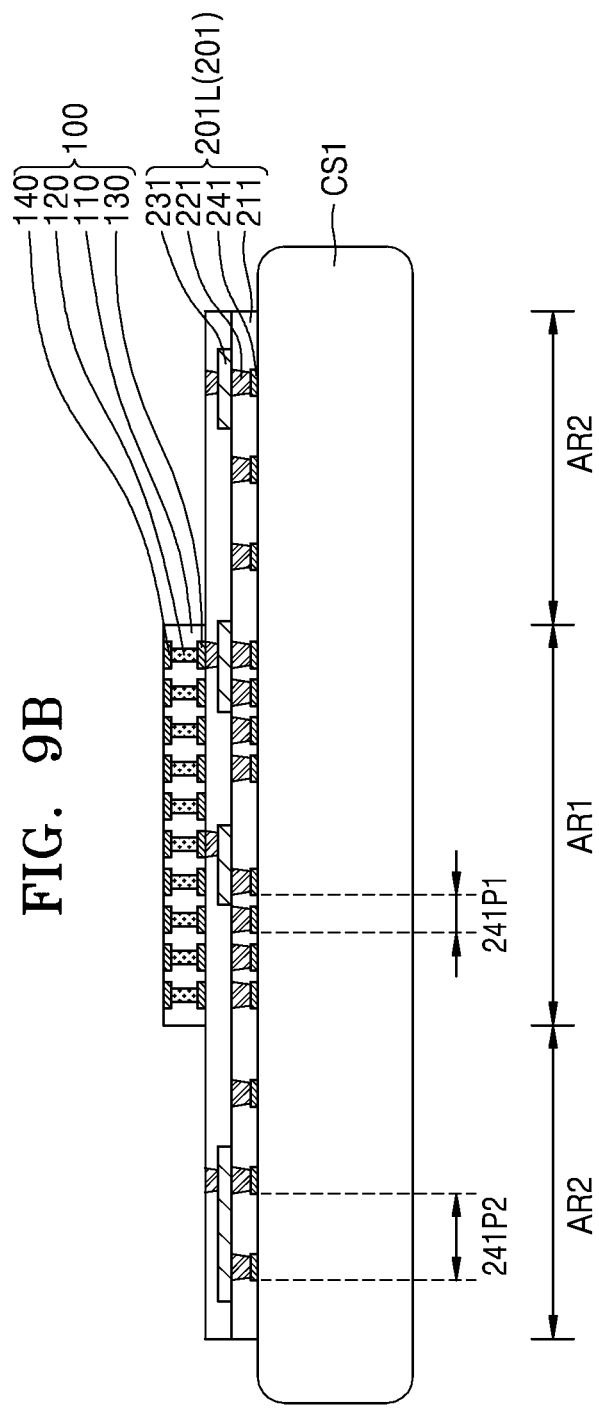

SEMICONDUCTOR PACKAGE INCLUDING INTERPOSER

CROSS-REFERENCE TO RELATED APPLICATION

This application is a continuation application of U.S. patent application Ser. No. 16/556,538, filed Aug. 30, 2019, which claims the benefit of priority to Korean Patent Application No. 10-2018-0146762, filed on Nov. 23, 2018, in the Korean Intellectual Property Office, the disclosure of each of which is incorporated herein in its entirety by reference.

BACKGROUND

The inventive concept relates to a semiconductor package and a method of manufacturing the same, and more particularly, to a semiconductor package including a redistribution layer and a method of manufacturing the same.

Recently, in the electronic product market, the demand for portable electronic devices is rapidly increasing, and thus, miniaturized and lightweight electronic elements, which are equipped in the portable electronic devices, are being continuously needed. A total thickness of each semiconductor package is reduced for miniaturizing and lightening electronic elements, but the need for increasing the capacity of memories is continuously increasing. Therefore, wafer level packages are being applied for efficiently arranging semiconductor chips in a limited structure of semiconductor packages.

SUMMARY

Aspects of the inventive concept provide a semiconductor package which includes a redistribution layer and enhances the reliability of an interconnection between a plurality of semiconductor chips.

However, the inventive concept is not limited to the aforesaid, but other objects not described herein will be clearly understood by those of ordinary skill in the art from descriptions below.

According to an aspect of the inventive concept, a semiconductor package includes a base package substrate, a first semiconductor chip, and a second semiconductor chip. The base package substrate includes a redistribution region where a redistribution layer is provided, a plurality of vertical conductive vias connected to the redistribution layer, and a recess region recessed from an upper surface of the redistribution region. The base package substrate further includes an interposer in the recess region, the interposer comprising a substrate, a plurality of upper pads disposed at an upper surface of the substrate, and plurality of through electrodes respectively connected to the plurality of upper pads to pass through the substrate. The first semiconductor chip and second semiconductor chip, each include a plurality of conductive interconnection terminals respectively connected to the plurality of upper pads and the vertical conductive vias exposed at the upper surface of the redistribution region. The first semiconductor chip and the second semiconductor chip are mounted on the extension region and the interposer and disposed horizontally apart from each other. As seen from a plan view, the interposer is disposed to overlap a portion of each of the first semiconductor chip and the second semiconductor chip.

According to another aspect of the inventive concept, which in one case is the same embodiment as the aspect described above, a semiconductor package includes a base package substrate, a first semiconductor chip mounted on the base package substrate, and a second semiconductor chip mounted on the base package substrate and horizontally spaced apart from the first semiconductor chip. The base package substrate includes an insulative material portion formed of an interlayer insulating layer, including a recess region, and including a redistribution region where a plurality of redistribution layers are provided to be connected to a plurality of vertical conductive vias; and an interposer disposed in the recess region, the interposer comprising a base substrate, a plurality of upper pads disposed at an upper surface of the base substrate, and a plurality of through electrodes respectively connected to the plurality of upper pads to pass through the base substrate. The first semiconductor chip includes a plurality of first conductive interconnection terminals respectively connected to a first set of the plurality of upper pads; and a plurality of second conductive interconnection terminals respectively connected to a first set of the plurality of vertical conductive vias outside of the recess region. The second semiconductor chip includes a plurality of third conductive interconnection terminals respectively connected to a second set of the plurality of upper pads; and a plurality of fourth conductive interconnection terminals respectively connected to a second set of the plurality of vertical conductive vias outside of the recess region. As seen from a plan view, the interposer is disposed to overlap a portion of each of the first semiconductor chip and the second semiconductor chip.

According to another aspect of the inventive concept, a semiconductor package includes a first extension region comprising a first redistribution region where a first redistribution layer is provided, and a plurality of connection pads disposed on an upper surface of the first redistribution region and connected to the redistribution layer; a second extension region under the first extension region, the second extension region comprising a second redistribution region where a second redistribution layer is provided, a plurality of vertical conductive vias connecting the first redistribution layer to the second redistribution layer, and a recess region recessed from an upper surface of the second redistribution region; an interposer in the recess region, the interposer comprising a substrate, a plurality of upper pads disposed at an upper surface of the substrate, and a plurality of through electrodes respectively connected to the plurality of upper pads to pass through the substrate; and a first semiconductor chip and a second semiconductor chip each comprising a plurality of interconnection terminals respectively connected to a respective set of the connection pads, the first semiconductor chip and the second semiconductor chip being disposed horizontally apart from each other on the first extension region. As seen from a plan view, the interposer is disposed to overlap a portion of each of the first semiconductor chip and the second semiconductor chip.

According to another aspect of the inventive concept, a semiconductor package includes an extension region comprising a redistribution region where a redistribution layer is provided, a plurality of vertical conductive vias connected to the redistribution layer, and a plurality of recess regions recessed from an upper surface of the redistribution region; a plurality of interposers in the plurality of recess regions respectively, the plurality of interposers each comprising a substrate, a plurality of upper pads disposed at an upper surface of the substrate, and a plurality of through electrodes respectively connected to the plurality of upper pads to pass through the substrate; and a plurality of semiconductor chips each comprising a plurality of respective interconnection terminals connected to the plurality of upper pads and the plurality of vertical conductive vias exposed at the upper surface of the redistribution region, the plurality of semiconductor chips being mounted on the extension region and the plurality of interposers and disposed horizontally spaced apart from one another. As seen from a plan view, each of the plurality of interposers is disposed to overlap a portion of each of at least two of the plurality of semiconductor chips.

BRIEF DESCRIPTION OF THE DRAWINGS

Embodiments of the inventive concept will be more clearly understood from the following detailed description taken in conjunction with the accompanying drawings in which:

FIGS. 2A, 2B, 3A, 3B, 4A, 4B, 5A, and 5B are diagrams illustrating a semiconductor package according to another embodiment;

FIGS. 7A to 7J are cross-sectional views illustrating a method of manufacturing a semiconductor package in a process sequence, according to an embodiment;

FIGS. 9A to 9C are cross-sectional views illustrating a method of manufacturing a semiconductor package in a process sequence, according to another embodiment;

DETAILED DESCRIPTION OF THE EMBODIMENTS

Hereinafter, embodiments will be described in detail with reference to the accompanying drawings.

Figure 1A:
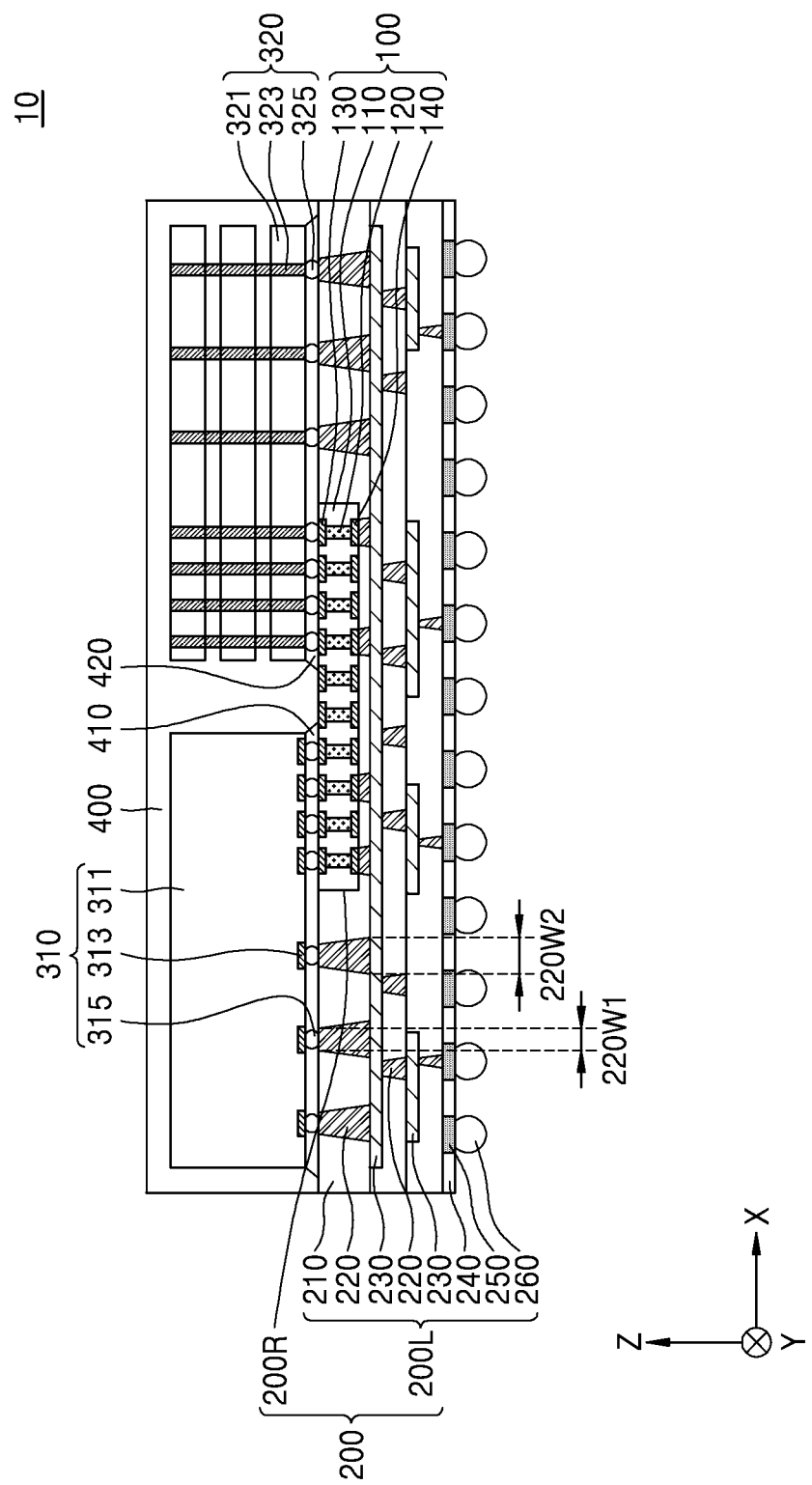
FIGS. 1A and 1B are diagrams illustrating a semiconductor package according to an embodiment.
Figure 1B:
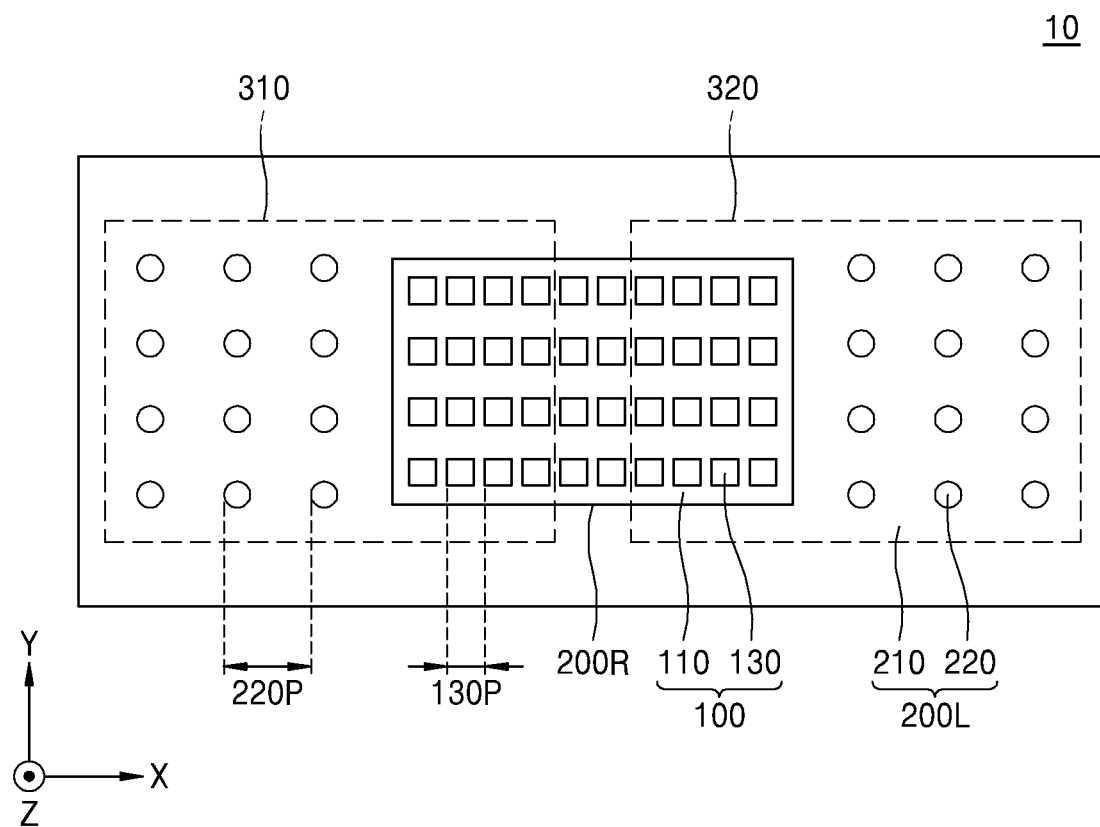

FIGS. 1A and 1B are diagrams illustrating a semiconductor package 10 according to an embodiment. A semiconductor package, as discussed herein, refers to a semiconductor device including one or more semiconductor chips (e.g., one or more dies formed from a wafer) disposed on a package substrate and collectively covered or surrounded by an encapsulation layer, also described herein as a molding part. In detail, FIG. 1A is a side cross-sectional view taken along a first direction X and second direction Z of the semiconductor package 10, and FIG. 1B is a plan view of the semiconductor package 10. Also, in FIG. 1B, for convenience of description, a molding part 400 is not illustrated, and each of first and second semiconductor chips 310 and 320 is illustrated as a broken line. As mentioned above, a semiconductor chip refers to a die formed from a wafer, such as a silicon wafer for example, and includes an integrated circuit formed thereon. A semiconductor chip as described herein may refer to a stack of dies formed from a wafer, or may refer to a single die formed from a wafer.

Referring to FIGS. 1A and 1B, the semiconductor package 10 may include an interposer 100 including a through electrode 120 (only one through electrode 120 is labeled, though a plurality of through electrodes are included), an extension region 200 including a redistribution region 200L where a redistribution layer 230 is provided and a recess region 200R, and the first and second semiconductor chips 310 and 320, which are provided on the extension region 200 and the interposer 100 and are spaced apart from each other in a horizontal direction (e.g., X direction).

The interposer 100 may include a base substrate 110 and a conductive structure provided on the base substrate 110. In one embodiment, the base substrate 110 may be formed from a silicon wafer including silicon (Si) (for example, crystalline silicon, polycrystalline silicon, or amorphous silicon) or another semiconductor wafer, and may be described as formed from a wafer substrate. The conductive structure may include an upper pad 130 which is provided at an upper surface of the base substrate 110 and is electrically connected to the first and second semiconductor chips 310 and 320, the through electrode 120, which is provided in a body portion of the base substrate 110 and is connected to the upper pad 130, and a lower pad 140 which is provided at a lower surface of the base substrate 110 and is connected to the through electrode 120. Although only one through electrode 120, upper pad 130, and lower pad 140 are labeled, a plurality of through electrodes, upper pads, and lower pads are included. Here, the lower pads 140 may be electrically connected to the redistribution layer 230 through vertical vias 220 (e.g., vertical conductive vias) of the redistribution region 200L. For example, a through electrode 120 may be directly electrically connected to the redistribution layer 230, disposed under the interposer 100, through a vertical via 220. A direct electrical connection refers to a connection between conductive elements that form a continuous conductive path. In this case, each of the through electrode 120 and the vertical via 220 may be directly physically connected to the redistribution layer 230 to form the direct electrical connection. Items generally described herein as being directly connected, or directly physically connected (e.g., without the "electrical" qualifier) are connected without other items formed therebetween. The term "contact" or forms thereof refers to a direct connection.

It should be noted that a plurality of vertical vias are labeled as 220, and a plurality of redistribution layers 230 are labeled as 230. However, these are separate vias or layers. In general, a vertical via, also described herein as a vertical conductive via, extends vertically (e.g., in the Z direction) to connect to a terminal (e.g., pad, ball, or bump) or redistribution layer at a first end and to a redistribution layer at a second, opposite end.

In some embodiments, the interposer 100 may further include a circuit region (not shown), and a buffer circuit for controlling capacitance loading of each of the first and second semiconductor chips 310 and 320 may be provided in the circuit region. In other embodiments, a semiconductor integrated circuit (IC) including at least one element selected from among a transistor, a diode, a capacitor, and a resistor may be provided in the circuit region. Depending on the case, the circuit region may not be provided.

Moreover, the interposer 100 may be disposed under a region between the first and second semiconductor chips 310 and 320 to overlap the first and second semiconductor chips 310 and 320. That is, as seen from a plane, a portion of the interposer 100 may be disposed to overlap the first semiconductor chip 310, and another portion of the interposer 100 may be disposed to overlap the second semiconductor chip 320 (e.g., to overlap vertically, in the Z direction).

In general semiconductor packages, when the number of signal terminals for the miniaturization or input/output of semiconductor chips is large, it is difficult to place all of the signal terminals on main surfaces of semiconductor chips. For this reason, in general semiconductor packages, a redistribution layer may extend to the outside of the main surfaces of the semiconductor chips, and thus, a region where the signal terminals are disposed may extend. For example, in the general semiconductor packages, a fan-out wafer level package (FO-WLP) or a fan-out panel level package (FO-PLP) (hereinafter each referred to as an FO-WLP) structure is being applied.

Unlike the general semiconductor packages having such an FO-WLP structure, the semiconductor package 10 according to certain embodiments may include the interposer 100 and the redistribution region 200L, which are disposed under the first and second semiconductor chips 310 and 320 to partially overlap the first and second semiconductor chips 310 and 320. The interposer 100 and redistribution region 200L may together serve as a package substrate formed of a plurality of electrical components and connections passing through a body formed of insulative material, and may be collectively referred to as a base package substrate. The interposer 100 may form a first portion of the base package substrate, such as a semiconductor material portion of the base package substrate.

In the FO-WLP structure, the semiconductor package 10 according to an embodiment may be implemented in a chip-last manner where the redistribution region 200L is first formed, and then, the first and second semiconductor chips 310 and 320 are mounted on the redistribution region 200L.

The redistribution region 200L may include the redistribution layers 230, the vertical vias 220, which vertically connect adjacent redistribution layers 230, and an interlayer insulation layer 210 (which may include a plurality of stacked interlayer insulating layers), which includes an insulating material and surrounds a periphery of each of the redistribution layer 230 and the vertical vias 220. Structurally, an uppermost surface of each vertical via is 220 exposed at an upper surface of the redistribution region 200L, and an uppermost surface of the interlayer insulation layer 210, and an uppermost surface of the vertical vias 220 may be substantially disposed on a coplanar surface (e.g., to be coplanar). The uppermost surface of the interlayer insulation layer 210 may form the uppermost surface of the interposer 100. The interlayer insulation layer 210 may be formed of one or more insulative materials that form a first portion of the base package substrate, such as an insulative material portion of the base package substrate.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially coplanar," may be exactly the same, equal, or planar, or may be the same, equal, or planar within acceptable variations that may occur, for example, due to manufacturing processes.

The vertical via 220 may have a trapezoid vertical cross-sectional shape where a width thereof is increases away from the first and second semiconductor chips 310 and 320 in a vertical direction. For example, the vertical via 220 may include a tapered sidewall where a width 220W1 (e.g., in a horizontal direction) of an upper surface thereof is narrower than a width 220W2 of a lower surface thereof.

The recess region 200R may denote a region where the interposer 100 is disposed. In terms of the extension region 200, the recess region 200R may be defined as a space which is recessed from an upper surface of the redistribution region 200L, but in terms of the interposer 100, the recess region 200R may be defined as a space defined by the interposer 100. Therefore, a depth of the recess region 200R may be substantially the same as a thickness of the interposer 100.

Moreover, the recess region 200R may be disposed under the region between the first and second semiconductor chips 310 and 320 to overlap the first and second semiconductor chips 310 and 320. That is, as seen from a plan view, a portion of the recess region 200R may be disposed to overlap the first semiconductor chip 310, and another portion of the recess region 200R may be disposed to overlap the second semiconductor chip 320.

The first semiconductor chip 310 may include a single logic chip, and for example, may be implemented as a microprocessor, a graphics processor, a signal processor, a network processor, a chipset, an audio codec, a video codec, an application processor, or a system on chip (SoC). However, the present embodiment is not limited thereto.

The first semiconductor chip 310 may include a semiconductor substrate 311 which includes an active surface and an inactive surface opposite to each other and a first chip pad 313 (one of a plurality of first chip pads 313) which is disposed at a lower surface of the semiconductor substrate 311. The first chip pad 313 may be connected to a logic device (not shown) of the first semiconductor chip 310 through a wiring structure (not shown).

A first set of the first chip pads 313 may be directly electrically connected to, through first interconnects 315, respective upper pads 130 disposed at an upper surface of the interposer 100. For example, some of the first chip pads 313 may directly connect to a respective first interconnect 315, which is directly connected to a respective upper pad 130. The first chip pad 313 and the upper pad 130 may each be used as a terminal for transmitting an input/output data signal of each of the first semiconductor chip 310 and the interposer 100, and thus may connect to input/output circuitry of the first semiconductor chip 310. Thus, the first chip pads 313 in the recess region 200R may be referred to as input/output pads. The recess region 200R may also be referred to as an input/output region of the semiconductor package 10, or as a high density interconnect region of the semiconductor package 10. The number and disposition of first chip pads 313 and upper pads 130 are exemplarily illustrated. Pads as described herein refers to conductive terminals that have a flat surface for connecting to other electrically conductive elements. First interconnect 315 may be a conductive interconnection terminal such as, for example, a conductive bump.

Another second set of the first chip pads 313 may be directly electrically connected to respective vertical vias 220 of the extension region 200 through the first interconnects 315. For example, some of the first chip pads 313 may directly connect to a respective first interconnect 315, which is directly connected to a respective vertical via 220. The first chip pad 313 and the vertical via 220 may each be used as a terminal for a ground and/or power of the first semiconductor chip 310. Thus, the first chip pads 313 in the redistribution region 200L may be referred to as power pads or terminals (which are used to transfer power signals or ground). The redistribution region 200L may also be referred to as power region of the semiconductor package 10, or as a low density interconnect region of the semiconductor package 10 (which has a lower density of interconnects such as pads from a plan view than the high density interconnect region). The number and disposition of first chip pads 313 and vertical vias 220 are exemplarily illustrated.

The second semiconductor chip 320 may include a high bandwidth memory chip. In some embodiments, the second semiconductor chip 320 may include a volatile memory chip and/or a non-volatile memory chip. The volatile memory chip may include, for example, dynamic random access memory (DRAM), static random access memory (SRAM), thyristor random access memory (TRAM), zero capacitor random access memory (ZRAM), or twin transistor random access memory (TTRAM). Also, the non-volatile memory chip may include, for example, magnetic random access memory (MRAM), spin-transfer torque MRAM (STT-MRAM), ferroelectric random access memory (FRAM), phase change random access memory (PRAM), resistive random access memory (RRAM), nanotube random access memory, polymer random access memory, or insulator resistance change memory.

The second semiconductor chip 320 may include a memory chip set including a plurality of stacked memory chips which enable pieces of data to be merged therebetween. Each of the memory chips configuring the second semiconductor chip 320 may include a semiconductor substrate 321, e.g., formed from a wafer, which includes an active surface and an inactive surface opposite to each other, a memory device (not shown) provided on the active surface, and through substrate vias, such as through silicon vias (TSV) 323 passing through the semiconductor substrate 321.

The second semiconductor chip 320 may include second chip pads (not shown), which are disposed at a lower surface thereof and is connected to the TSV 323. The second semiconductor chip 320 may be connected to a second interconnect 325 through the second chip pad. The second interconnect may be a conductive terminal, such as a conductive bump.

A first set of the TSVs 323 may be directly electrically connected to, through second interconnects 325, respective upper pads 130 disposed on an upper surface of the interposer 100. For example, the first set of the TSVs 323 may directly connect to respective second interconnects 325, which directly connect to respective upper pads 130. The TSVs 323 and the upper pads 130 may each be used as a terminal for transmitting an input/output data signal of each of the second semiconductor chip 320 and the interposer 100. The number and disposition of TSVs 323 and upper pads 130 are exemplarily illustrated, and thus may connect to input/output circuitry of the second semiconductor chip 320. Thus, the second chip pads (not shown) in the recess region 200R may be referred to as input/output pads.

A second set of the TSVs 323 may be directly electrically connected to respective vertical vias 220 of the extension region 200 through the second interconnects 325. For example, the second set of TSVs 323 may directly connect to respective second interconnects 325, which directly connect to respective vertical vias 220. The TSVs 323 and the vertical vias 220 may each be used as a terminal for a ground and/or power of the second semiconductor chip 320. Thus, the second chip pads in the redistribution region 200L may be referred to as power pads. The number and disposition of TSVs 323 and vertical vias 220 are exemplarily illustrated.

In a system in package where a plurality of individual semiconductor chips are integrated into one package, the number of memory chips configuring the second semiconductor chip 320 may vary based on the use of the semiconductor package 10. The number of memory chips configuring the second semiconductor chip 320 is not limited to the number of illustrated memory chips.

The memory chips configuring the second semiconductor chip 320 may be attached on one another by an adhesive member (not shown) and may be stacked. The adhesive member may include a die attach film. Examples of the die attach film may include an inorganic adhesive and a polymer adhesive. Also, the die attach film may be a hybrid type which is produced by mixing the inorganic adhesive with the polymer adhesive.

In the semiconductor package 10, as seen from a plan view, a flat surface area of the interposer 100 may be less than that of a combined surface area of the first and second semiconductor chips 310 and 320, and in some embodiments may be less than a surface area of either one of the first semiconductor chip 310 or the second semiconductor chip 320. Also, a minimum pitch 130P of the upper pads 130 may be less than a minimum pitch 220P of the vertical vias 220 exposed at the upper surface of the redistribution region 200L.

The molding part 400 may seal at least a side surface of each of the first and second semiconductor chips 310 and 320 to protect the first and second semiconductor chips 310 and 320 from an external environment.

An appropriate amount of molding resin may be injected onto the upper surface of each of the interposer 100 and the extension region 200 through an injection process, and the molding part 400 may form an external appearance of the semiconductor package 10 through a curing process. In some embodiments, examples of the molding resin may include an epoxy-group molding resin, a polyimide-group molding resin, etc.

The molding part 400 may protect the first and second semiconductor chips 310 and 320 from an external influence such as an impact. In some embodiments, the molding part 400 may be provided to surround an upper surface of each of the first and second semiconductor chips 310 and 320. In other embodiments, the molding part 400 may be provided to externally expose the upper surface of each of the first and second semiconductor chips 310 and 320.

The molding part 400 may cover the upper surface of each of the interposer 100 and the extension region 200, and thus, a width of the molding part 400 may be substantially the same as that of the semiconductor package 10. Also, a side surface of the interlayer insulation layer 210 and a side surface of the molding part 400 may be substantially coplanar.

In a general semiconductor package structure, all chip pads included in each of a logic chip and a memory chip may be disposed on an interposer to transmit an input/output data signal and/or supply power through a through electrode of the interposer and/or may be grounded. The through electrodes may be provided to have a pitch which is finer than that of a redistribution layer, but may be relatively expensive in manufacturing cost and may be relatively complicated in manufacturing process.

On the other hand, the semiconductor package 10 according to certain embodiments may have a structure where a region requiring a relatively high density interconnect (HDI) like the input/output data signal of each of the first and second semiconductor chips 310 and 320 transmits a signal through the through electrodes 120 of the interposer 100 (e.g., to pass input/output data signals between the first semiconductor chip 310 and the second semiconductor chip 320, which may be transmitted through the interposer 100), and a region requiring a relatively low density interconnect like a ground and/or power of each of the first and second semiconductor chips 310 and 320 is connected to an external interconnect 260 through the vertical vias 220 and the redistribution layers 230 without connecting to the through electrodes 120 of the interposer 100.

Therefore, the semiconductor package 10 according to an embodiment may more efficiently use an area occupied by a path in signal transmission than a case where all chip pads of each semiconductor chip transmits a signal through a through electrode of an interposer like the general semiconductor package structure. Also, in the semiconductor package 10 having the same area, an electrical resistance for signal transmission may be distributed to different paths, thereby enhancing the performance of the semiconductor package 10.

As a result, in the FO-WLP structure of the semiconductor package 10 according to an embodiment, the interposer 100 including the through electrodes 120 may be disposed in a region having an HDI of each of the first and second semiconductor chips 310 and 320, and the redistribution region 200L including the redistribution layer 230 may be provided in another region having a low density interconnect, thereby realizing substantially the same performance even without using the interposer 100 having a large area. That is, according to an embodiment, a technical limitation caused by an exposure area of an exposer for producing the interposer 100 having a large area may be overcome. Therefore, in the semiconductor package 10 according to certain embodiments, productivity and economic efficiency in manufacturing the semiconductor package 10 may increase.

FIGS. 2A, 2B, 3A, 3B, 4A, 4B, 5A, and 5B are diagrams respectively illustrating semiconductor packages 20, 30, 40, and 50 according to another embodiment. STOPPED In the following description, most elements configuring each of the semiconductor packages 20, 30, 40, and 50 and materials included in the elements are substantially the same or similar to descriptions given above with reference to FIGS. 1A and 1B. Thus, for convenience of description, a difference with the semiconductor package 10 (see FIG. 1A) will be mainly described.

Figure 2A:
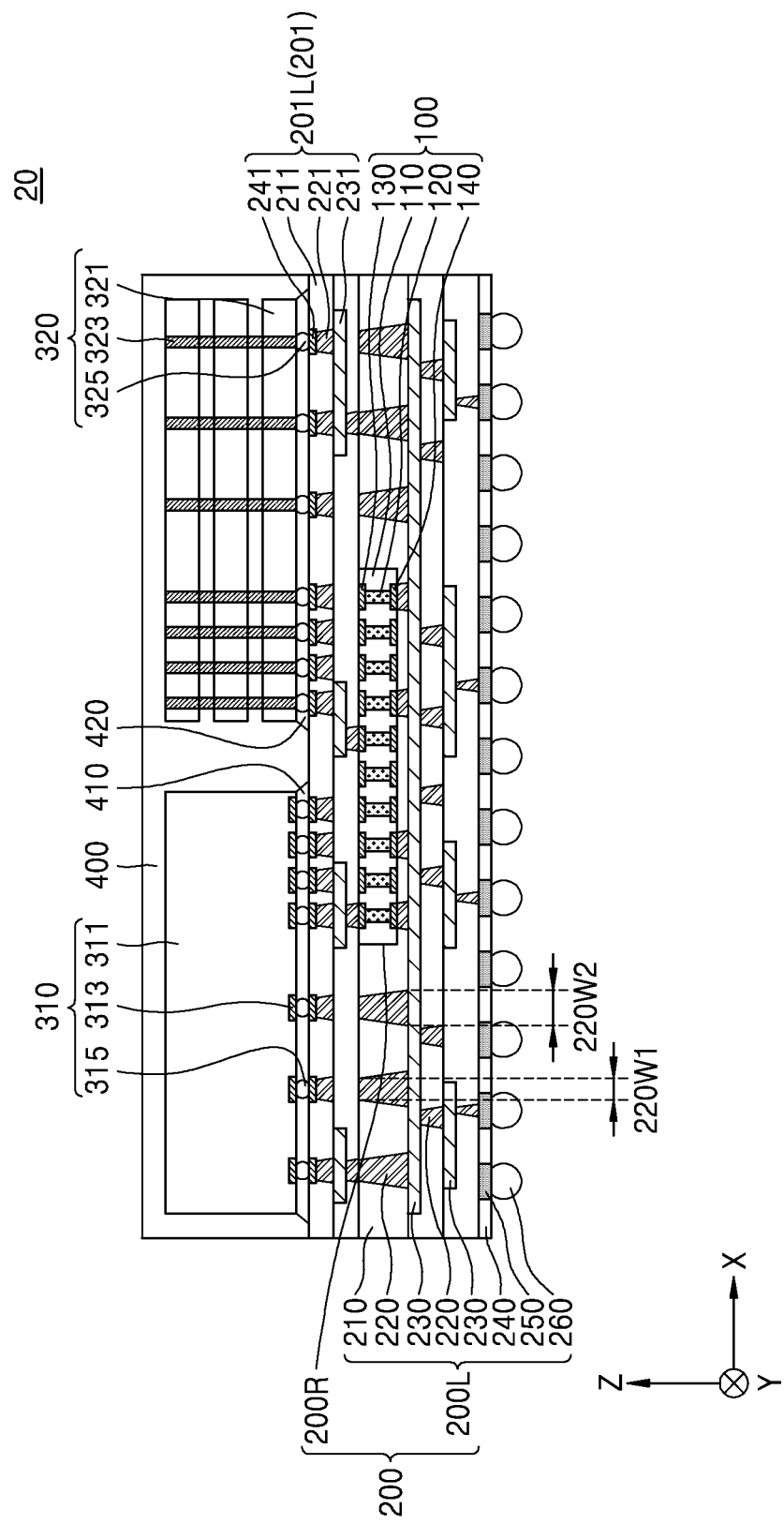
Figure 2B:
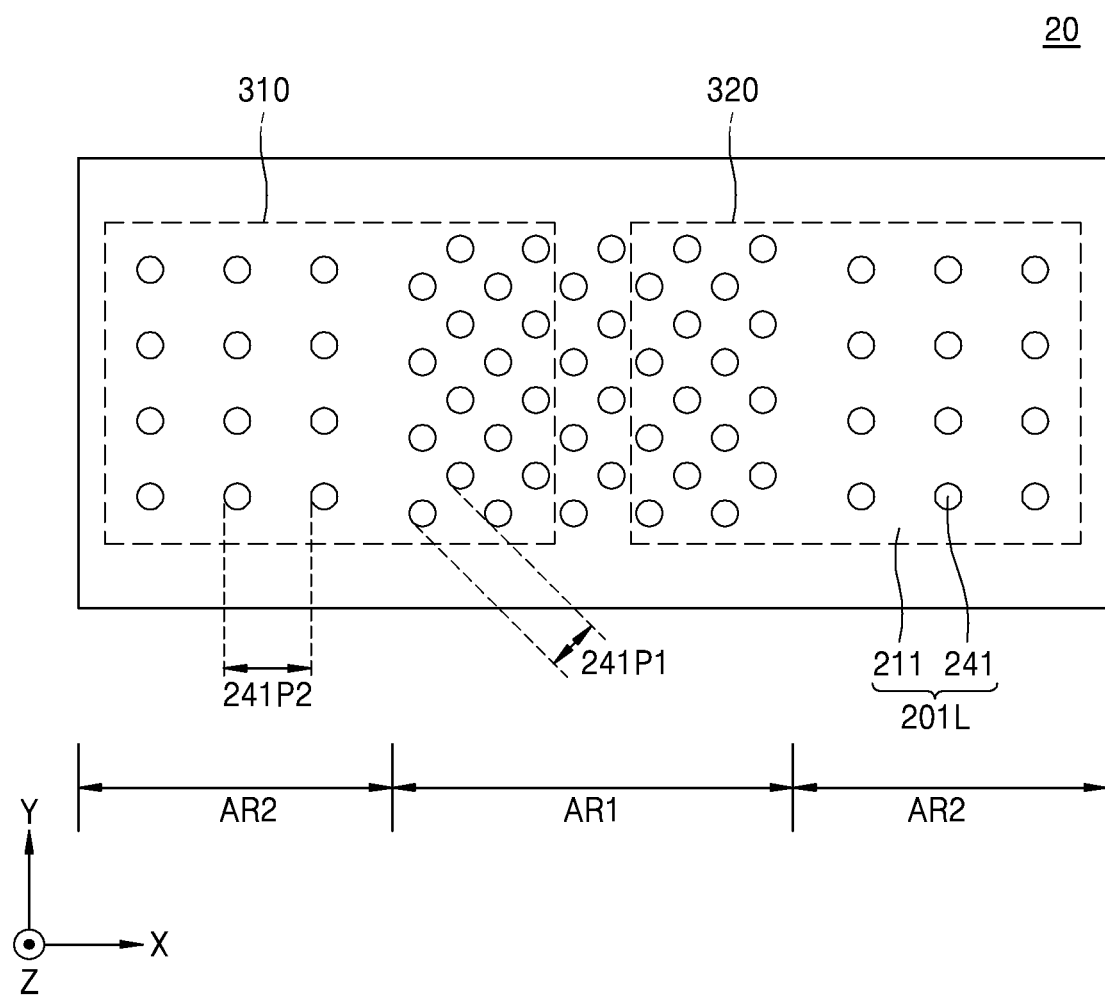

Referring to FIGS. 2A and 2B, the semiconductor package 20 may include a first extension region 201 including a first redistribution region 201L where a first redistribution layer 231 is provided, an interposer 100 including through electrodes 120, a second extension region 200 including a recess region 200R and a second redistribution region 200L where a second redistribution layer 230 is provided, and first and second semiconductor chips 310 and 320, which are provided on the first extension region 201 and are horizontally spaced apart from each other. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first extension region 201 including the first redistribution region 201L may include a first interlayer insulation layer 211 including an insulating material (and which may include a plurality of sub-layers), a connection via 221 (e.g., a plurality of connection vias 221) including a conductive material, a first redistribution layer 231 (e.g., a plurality of first redistribution layers 231), and a connection pad 241 (e.g., a plurality of connection pads 241).

Each of an upper surface and a lower surface of the first extension region 201 may substantially be a flat surface. Unlike the second extension region 200, the first extension region 201 may not include a recess region.

The connection pads 241 may be provided at an upper surface of the first redistribution region 201L. The connection pad 241 may include a copper (Cu), nickel (Ni), gold (Au), chromium (Cr), titanium (Ti), or palladium (Pd), or may include an alloy thereof. The connection pads 241 may be formed through a physical vapor deposition (PVD) process, a chemical vapor deposition (CVD) process, or the like.

A region where the connection pads 241 are provided may be divided into a first region AR1 where a plurality of connection pads 241 are arranged at a first minimum pitch 241P1 and a second region AR2 where a plurality of connection pads 241 are arranged at a second minimum pitch 241P2, which is greater than the first minimum pitch 241P1. The first region AR1 may be a region where the interposer 100 is disposed.

The connection pads 241 of the first region AR1 may be electrically connected to the through electrodes 120 of the interposer 100 through the first redistribution layer 231, and the connection pads 241 of the second region AR2 may be electrically connected to the second redistribution layer 230 through the first redistribution layer 231.

A connection via 221 may connect one first redistribution layer 231 to another first redistribution layer 231, or may connect a connection pad 241 to the first redistribution layer 231. The connection via 221 may include the same metal as that of the connection pad 241. In some embodiments, the connection via 221 may be formed through a plating process, and metal may be plated on a seed layer.

The connection vias 221 may each have a trapezoid vertical cross-sectional shape where a width thereof increases away from the first and second semiconductor chips 310 and 320 in a vertical direction. For example, the connection vias 221 may each include a tapered sidewall where a width of an upper surface thereof is narrower than a width of a lower surface thereof like the vertical via 220.

The first redistribution layer 231 may be electrically connected to the connection vias 221. The first redistribution layer 231 may include the same metal as that of the connection via 221. In some embodiments, a connection via 221 and a first redistribution layer 231 may be simultaneously formed through a damascene process or a dual damascene process. In other embodiments, the first redistribution layer 231 may be formed through a lift-off process.

The interposer 100 may be disposed in the recess region 200R of the second extension region 200 and may be surrounded by the first extension region 201 and the second extension region 200.

The first and second semiconductor chips 310 and 320 may be mounted on the first extension region 200 and may be spaced apart from the interposer 100 in a vertical direction. For example, in the embodiment of FIGS. 2A and 2B, the first and second semiconductor chips 310 and 320 do not contact the interposer 100.

The molding part 400 may cover a whole upper surface of the first extension region 201, and thus, a width of the molding part 400 may be substantially the same as that of the semiconductor package 20. Also, a side surface of the first extension region 201, a side surface of the second extension region 200, and a side surface of the molding part 400 may be substantially coplanar.

Figure 3A:
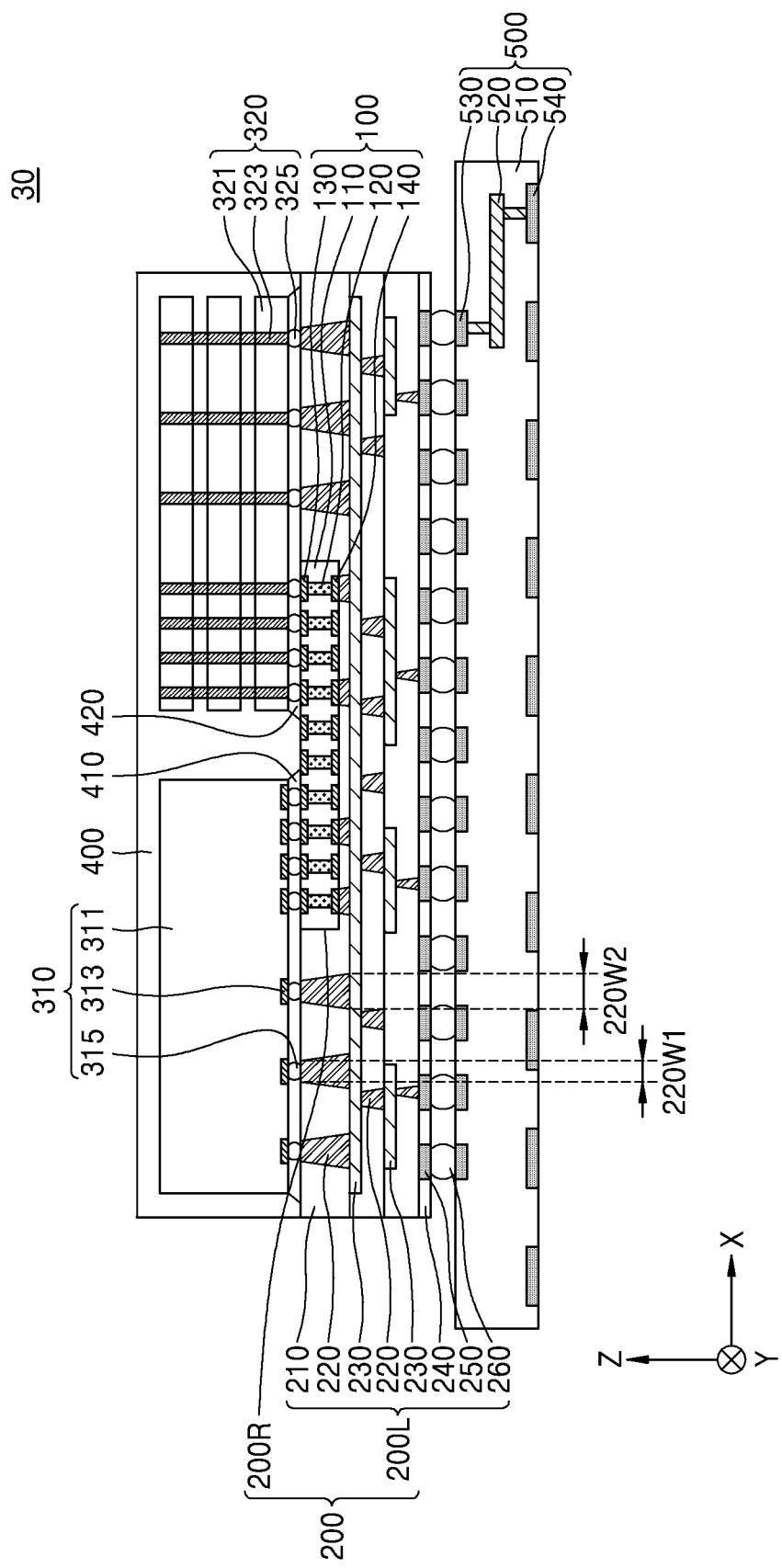
Figure 3B:
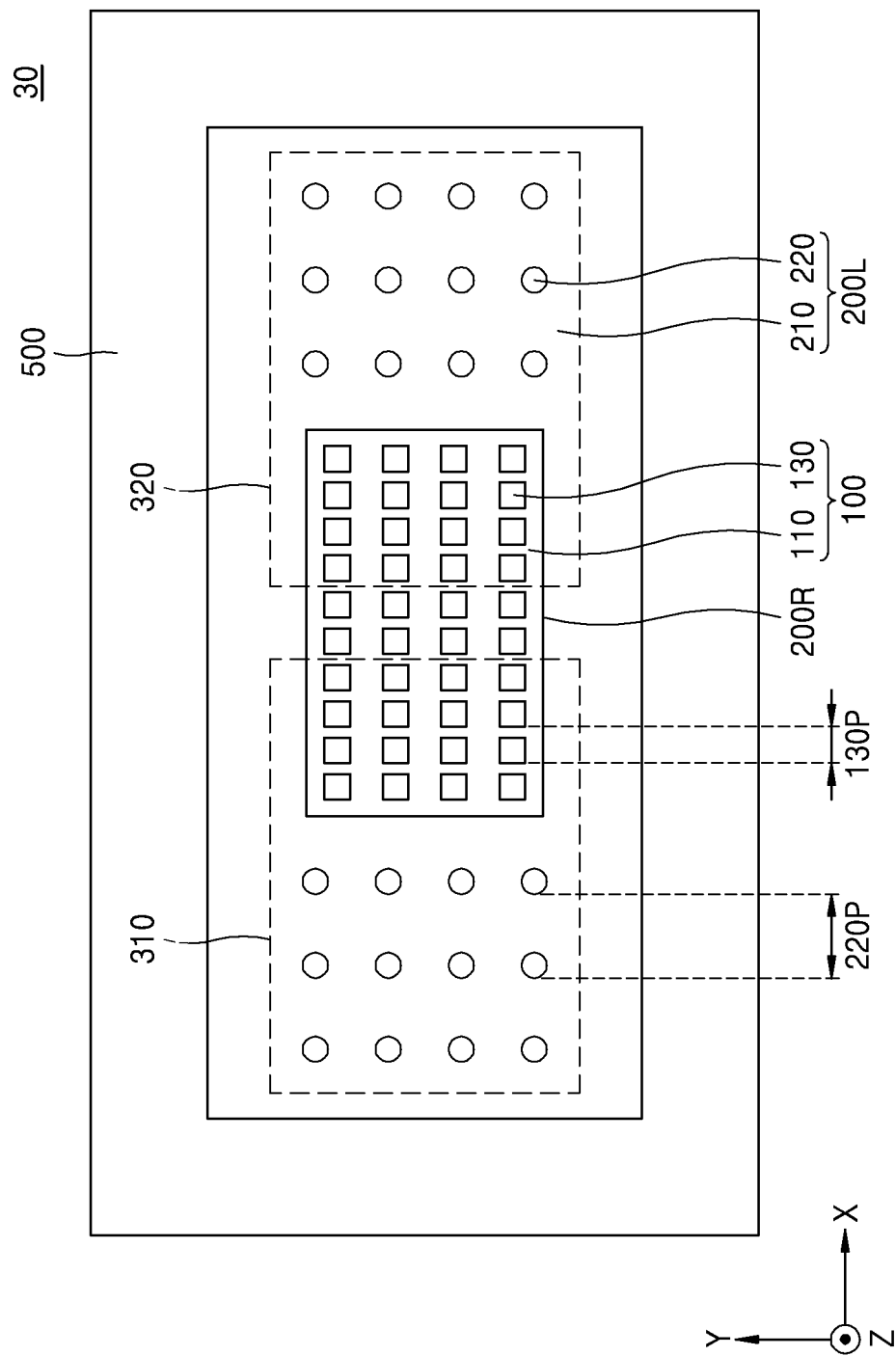

Referring to FIGS. 3A and 3B, the semiconductor package 30 may include an interposer 100 including a through electrodes 120, an extension region 200 including a redistribution region 200L and a recess region 200R, first and second semiconductor chips 310 and 320 which are mounted on the extension region 200 and the interposer 100 and are horizontally spaced apart from each other, and an additional package substrate 500 disposed under the extension region 200.

The package substrate 500 may include upper substrate pads 530 disposed on an upper surface thereof and low substrate pads 540 disposed on a lower surface of the package substrate 500. Also, the package substrate 500 may include internal wirings 520 which electrically connect the upper substrate pads 530 to the lower substrate pads 540. The package substrate 500 may include a printed circuit board (PCB). However, the package substrate 500 is not limited to a PCB.

The package substrate 500 may include a body portion 510 including at least one material selected from among phenol resin, epoxy resin, and polyimide. Also, the upper substrate pad 530, the lower substrate pad 540, and the internal wiring 520 may each include, for example, Cu, Ni, aluminum (Al), or beryllium copper.

The extension region 200 may be connected to the package substrate 500 through an external interconnects 260 (e.g., conductive interconnection terminals). The through electrodes 120 may be connected to the external interconnects 260 through the vertical vias 220 and the redistribution layers 230 each disposed under the interposer 100, and may be electrically connected to the package substrate 500.

Figure 4A:
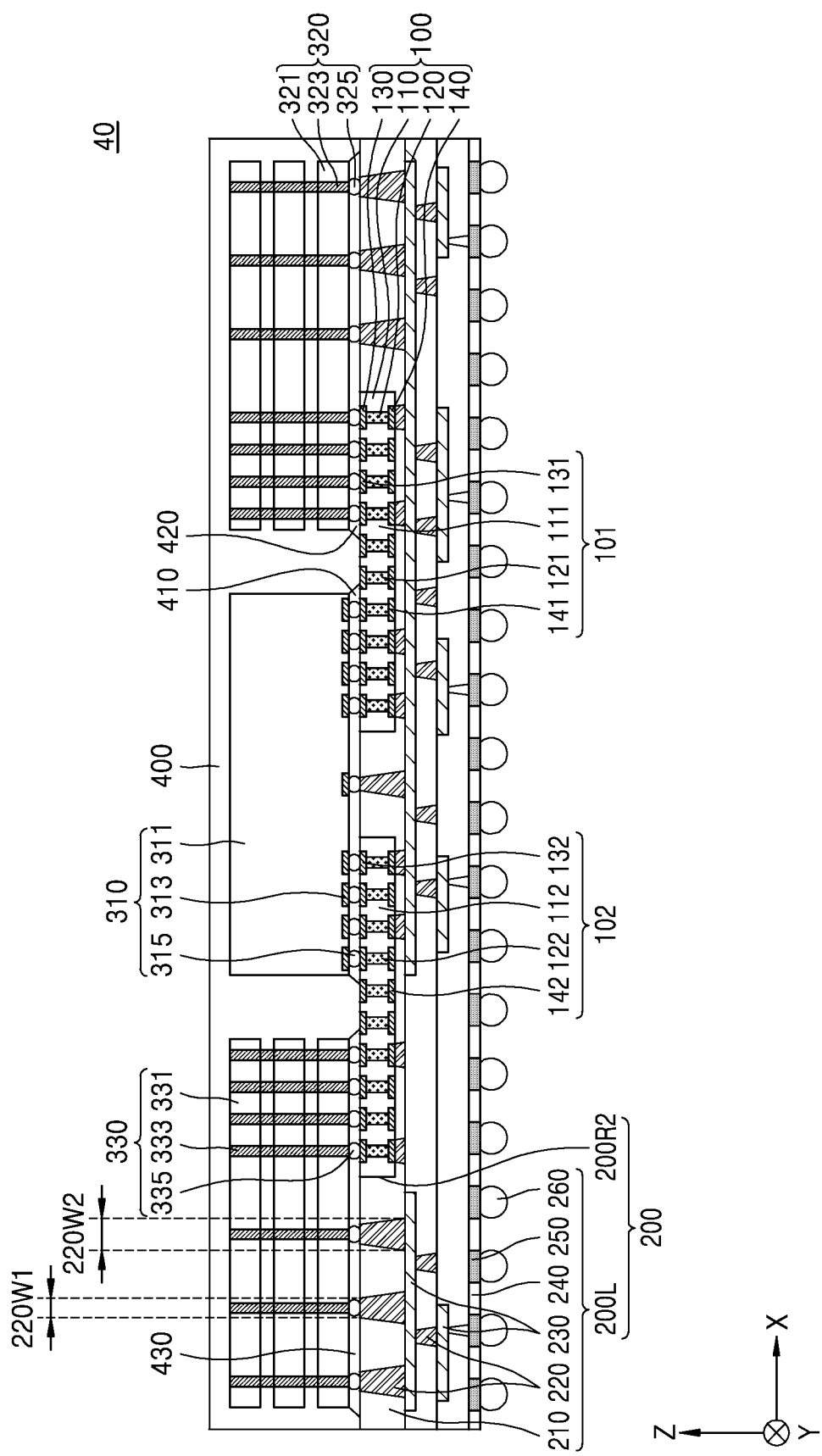

Referring to FIGS. 4A and 4B, the semiconductor package 40 may include a plurality of interposers (for example, first and second interposers) 101 and 102 respectively including a plurality of sets of through electrodes 121 and 122, an extension region 200 including a redistribution region 200L and a plurality of recess regions 200R1 and 200R2, and a plurality of semiconductor chips 310, 320, and 330 which are mounted on the extension region 200 and the plurality of interposers 101 and 102 and are spaced apart from one another.

The plurality of semiconductor chips 310, 320, and 330 may include, for example, a first semiconductor chip 310, a second semiconductor chip 320, and a third semiconductor chip 330, but the number of semiconductor chips is not limited thereto. The second and third semiconductor chips 320 and 330 may be respectively disposed adjacent to opposite sides of the first semiconductor chip 310, but are not limited thereto. The third semiconductor chip 330 may have substantially the same configuration as that of the second semiconductor chip 320. For example, the third semiconductor chip 330 may include a memory chip set including a plurality of memory chips which enable pieces of data to be merged therebetween.

Depths of the plurality of recess regions 200R1 and 200R2 may be substantially the same, and thicknesses of the plurality of interposers 101 and 102 may be substantially the same. The first interposer 101 may be disposed under a region between the first and second semiconductor chips 310 and 320 to overlap the first and second semiconductor chips 310 and 320. Also, the second interposer 102 may be disposed under a region between the first and third semiconductor chips 310 and 330 to overlap the first and third semiconductor chips 310 and 330.

Figure 5A:
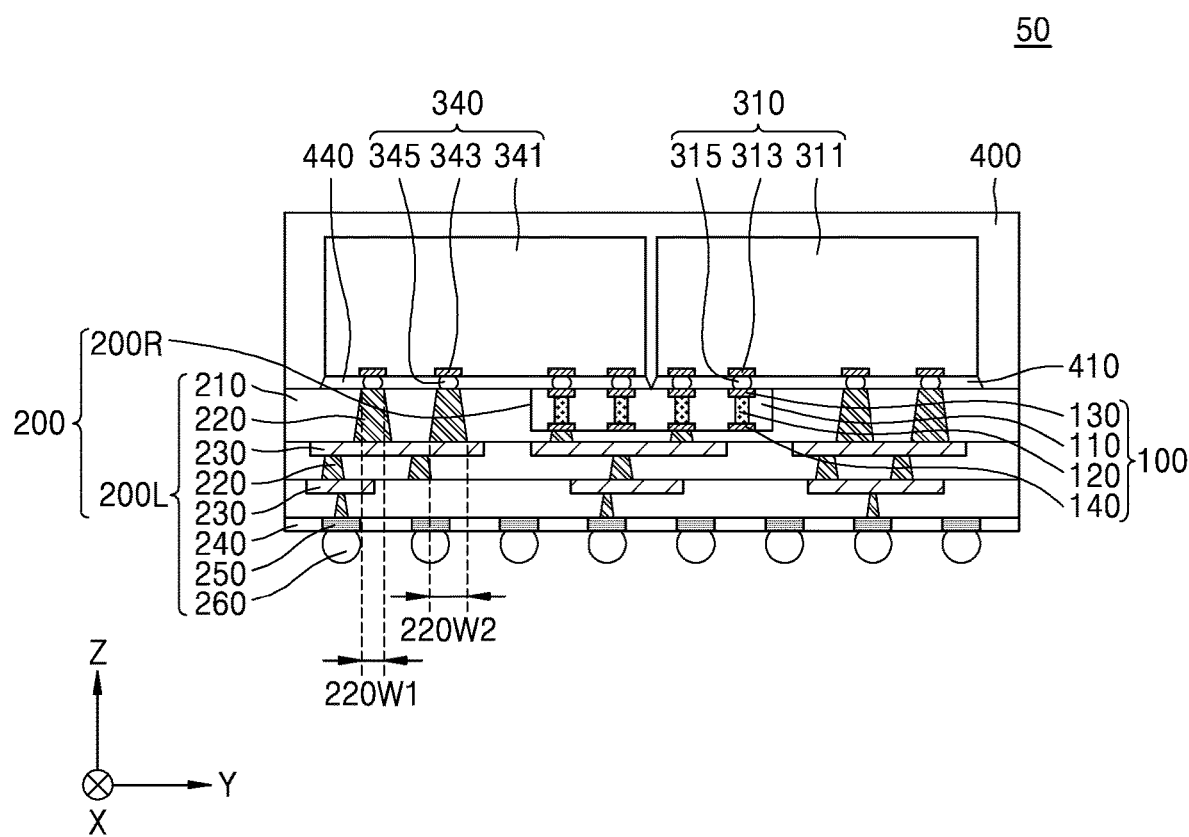
Figure 5B:
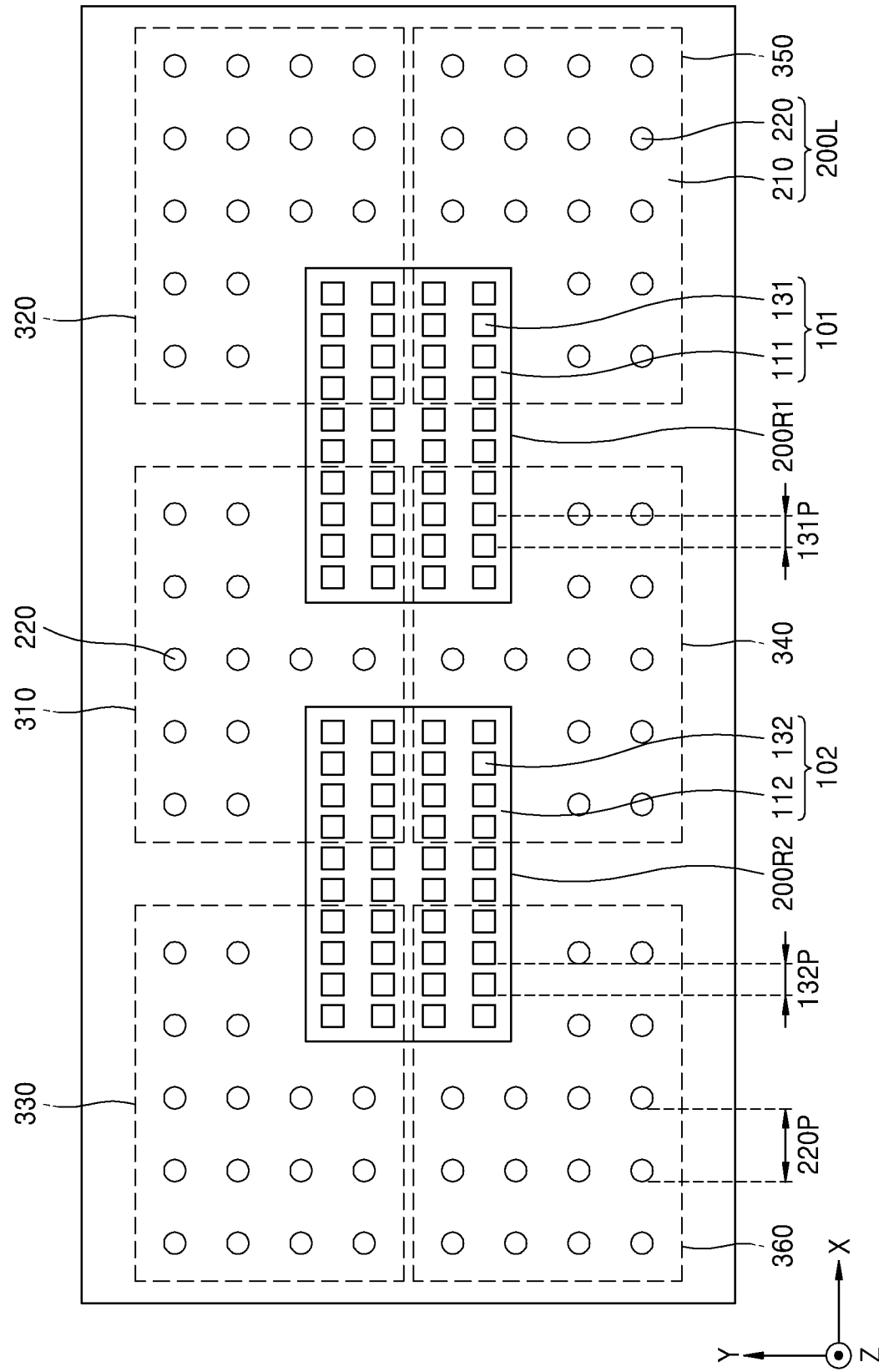

Referring to FIGS. 5A and 5B, the semiconductor package 50 may include a plurality of interposers (for example, first and second interposers) 101 and 102 respectively including a plurality of sets of through electrodes 131 and 132, an extension region 200 including a redistribution region 200L and a plurality of recess regions 200R1 and 200R2, and a plurality of semiconductor chips 310, 320, 330, 340, 350, and 360 which are mounted on the extension region 200 and the plurality of interposers 101 and 102 and are spaced apart from one another.

A side cross-sectional view of the semiconductor package 50 in a first direction X is substantially the same as FIG. 4A, and thus, FIG. 5A illustrates a side cross-sectional view in a second direction Y.

The plurality of semiconductor chips 310, 320, 330, 340, 350, and 360 may include, for example, a first semiconductor chip 310, a second semiconductor chip 320, a third semiconductor chip 330, a fourth semiconductor chip 340, a fifth semiconductor chip 350, and a sixth semiconductor chip 360, but the number of semiconductor chips is not limited thereto. The second and third semiconductor chips 320 and 330 may be respectively disposed adjacent to opposite sides of the first semiconductor chip 310, and the fifth and sixth semiconductor chips 350 and 360 may be respectively disposed adjacent to opposite sides of the fourth semiconductor chip 340. However, the present embodiment is not limited thereto.

The fourth semiconductor chip 340 may have substantially the same configuration as that of the first semiconductor chip 310. For example, the fourth semiconductor chip 340 may include a single logic chip. Also, the third, fifth, and sixth semiconductor chips 330, 350, and 360 may have substantially the same configuration as that of the second semiconductor chip 320. For example, the third, fifth, and sixth semiconductor chips 330, 350, and 360 may include a memory chip set including a plurality of memory chips which enable pieces of data to be merged therebetween.

Depths of the plurality of recess regions 200R1 and 200R2 may be substantially the same, and thicknesses of the plurality of interposers 101 and 102 may be substantially the same. The first interposer 101 may be disposed under a region between the first, second, fourth, and fifth semiconductor chips 310, 320, 340, and 350 to overlap the first, second, fourth, and fifth semiconductor chips 310, 320, 340, and 350. Also, the second interposer 102 may be disposed under a region between the first, third, fourth, and sixth semiconductor chips 310, 330, 340, and 360 to overlap the first, third, fourth, and sixth semiconductor chips 310, 330, 340, and 360.

Figure 6:
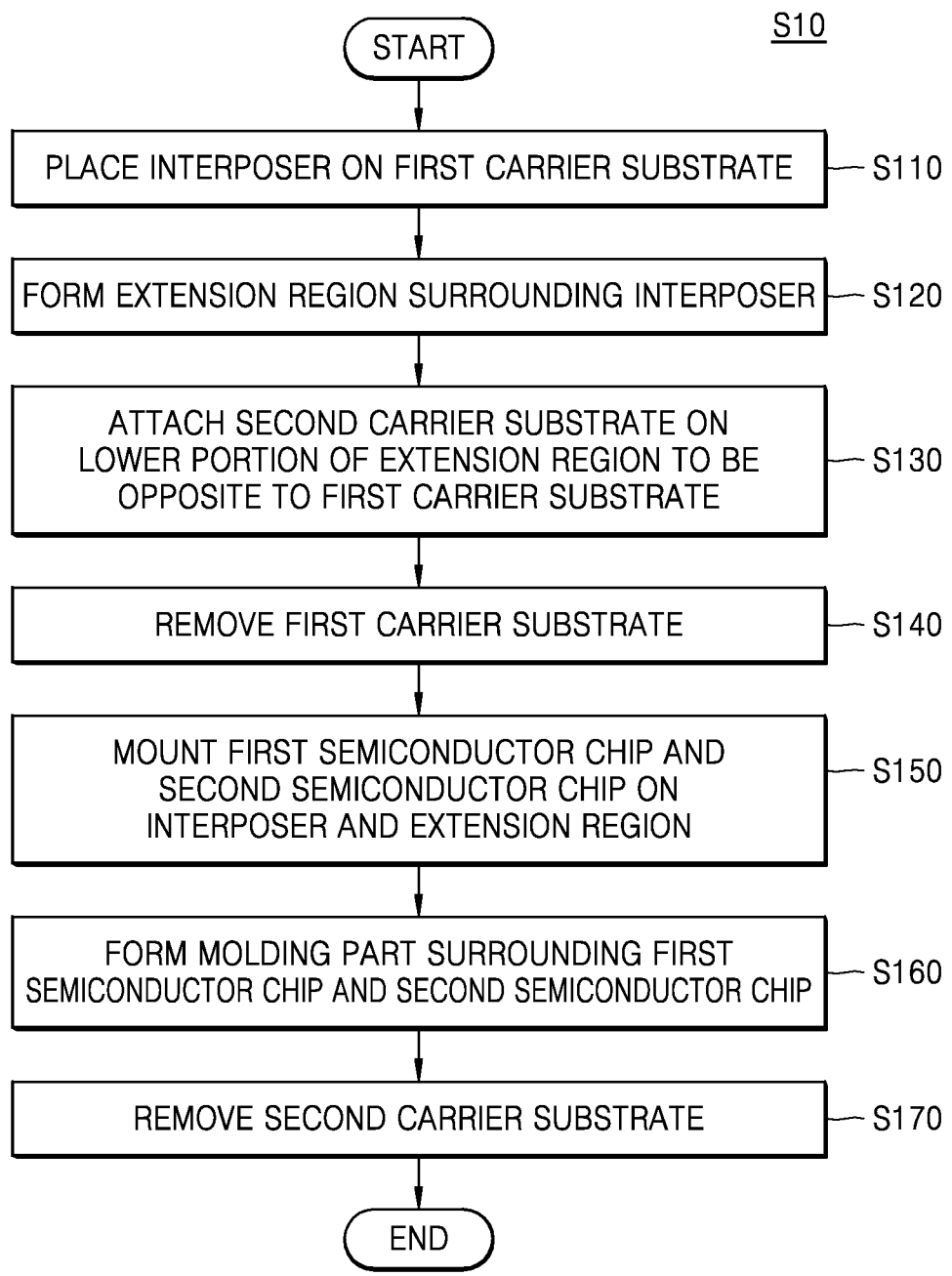
FIG. 6 is a flowchart illustrating a method of manufacturing a semiconductor package, according to an embodiment.

FIG. 6 is a flowchart illustrating a method S10 of manufacturing a semiconductor package, according to an embodiment.

Referring to FIG. 6, the method S10 of manufacturing the semiconductor package may include the following process sequence. In a case where some embodiments are capable of being differently implemented, a specific process sequence may be performed unlike a described process sequence. For example, two processes. which are successively described, may be substantially simultaneously performed, or may be performed in a process sequence opposite to a described process sequence.

The method S10 of manufacturing the semiconductor package according to an embodiment may include first operation S110 of placing an interposer on a first carrier substrate, second operation S120 of forming an extension region surrounding the interposer, third operation S130 of attaching a second carrier substrate on a lower portion of the extension region to be opposite to the first carrier substrate, fourth operation S140 of removing the first carrier substrate, fifth operation S150 of mounting a first semiconductor chip and a second semiconductor chip on the interposer and the extension region, sixth operation S160 of forming a molding part surrounding the first semiconductor chip and the second semiconductor chip, and seventh operation S170 of removing the second carrier substrate.

Technical features of first to seventh operations S110 to S170 will be described in detail with reference to FIGS. 7A to 7J described below.

FIGS. 7A to 7J are cross-sectional views illustrating a method of manufacturing a semiconductor package 10 in a process sequence, according to an embodiment.

Hereinafter, a contact surface of an interposer 100 contacting a first carrier substrate CS1 may be referred to as an upper surface, and an opposite surface opposite to the upper surface may be referred to as a lower surface.

Referring to FIG. 7A, the first carrier substrate CS1 may be attached on an upper surface of the interposer 100.

The interposer 100 may include a base substrate 110 and a conductive structure provided on the base substrate 110. The base substrate 110 may be, for example, a silicon wafer. The conductive structure may include an upper pad 130 which is provided at an upper surface of the base substrate 110, a through electrode 120 which is provided in a body portion of the base substrate 110 and is connected to the upper pad 130, and a lower pad 140 which is provided at a lower surface of the base substrate 110 and is connected to the through electrode 120. The through electrode 120, upper pad 130, and lower pad 140 may be provided in plural.

The first carrier substrate CS1 may include, for example, glass, Si, or aluminum oxide. In order to easily attach the interposer 100 on the first carrier substrate CS1, an adhesive layer (not shown) may be formed between the first carrier substrate CS1 and the interposer 100. The adhesive layer may be a liquid type or a gel type, which enables easy deformation by certain pressure.

Referring to FIG. 7B, an interlayer insulation layer 210, which includes an insulating material, surrounds a periphery of an interposer 100, and covers a whole lower surface of the interposer 100 may be formed on a first carrier substrate CS1.

The interlayer insulation layer 210 may include, for example, a photosensitive dielectric such as silicon oxide, silicon nitride, or photo imagable dielectric (PID). A recess region 200R included in the interlayer insulation layer 210 may denote a region where the interposer 100 is disposed.

A photo mask pattern PM may be formed on the interlayer insulation layer 210. A photoresist may be coated on the interlayer insulation layer 210, and then, by exposing and developing the photoresist, only a portion of the photoresist may remain and the other portion thereof may be removed, thereby forming the photo mask pattern PM.

The photo mask pattern PM may be a pattern which is arranged based on a constant rule, or may be a pattern which is irregularly arranged. Also, in a subsequent process, a shape of a vertical via hole 210H (see FIG. 7C) may be affected by adjusting a thickness and a width of the photo mask pattern PM.

Figure 7C:
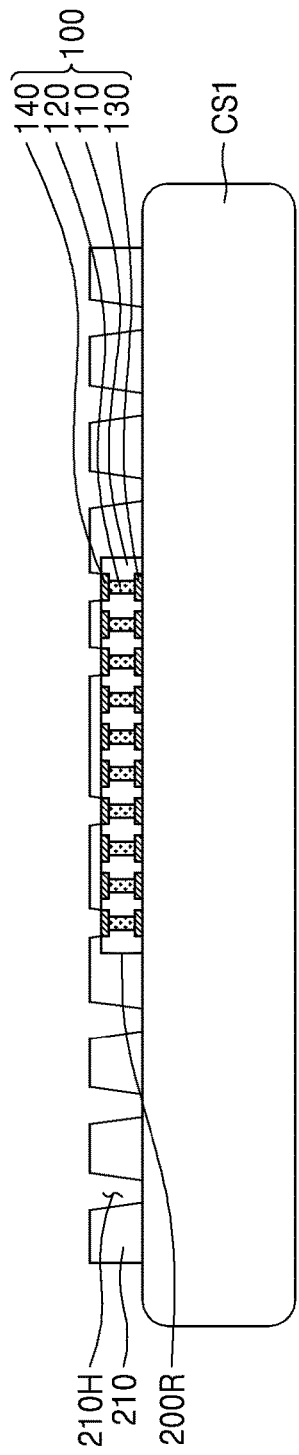

Referring to FIG. 7C, a portion of an interlayer insulation layer 210 may be etched by using a photo mask pattern PM (see FIG. 7B) as an etch mask, and the photo mask pattern PM may be removed through an ashing and strip process.

The etching may be a dry etching process. The interlayer insulation layer 210 including a plurality of vertical via holes 210H may be formed through the dry etching process. In terms of a characteristic of the dry etching process, each of the plurality of vertical via holes 210H may include a tapered sidewall where a width thereof is narrowed in a downward direction. In other embodiments, the vertical via holes 210H may each include a sidewall which is substantially perpendicular to an upper surface of a first carrier substrate CS1. In this case, the vertical via holes 210H may each have a rectangular cross-sectional shape.

Each of the vertical via holes 210H may partially expose the upper surface of the first carrier substrate CS1 and a lower pad 140 of an interposer 100. Also, as seen from a plane, an exposed portion of the upper surface of the first carrier substrate CS1 and an exposed portion of the lower pad 140 may each have a circular shape. That is, the interlayer insulation layer 210 may include the plurality of vertical via holes 210H each having a truncated-cone shape.

Figure 7D:
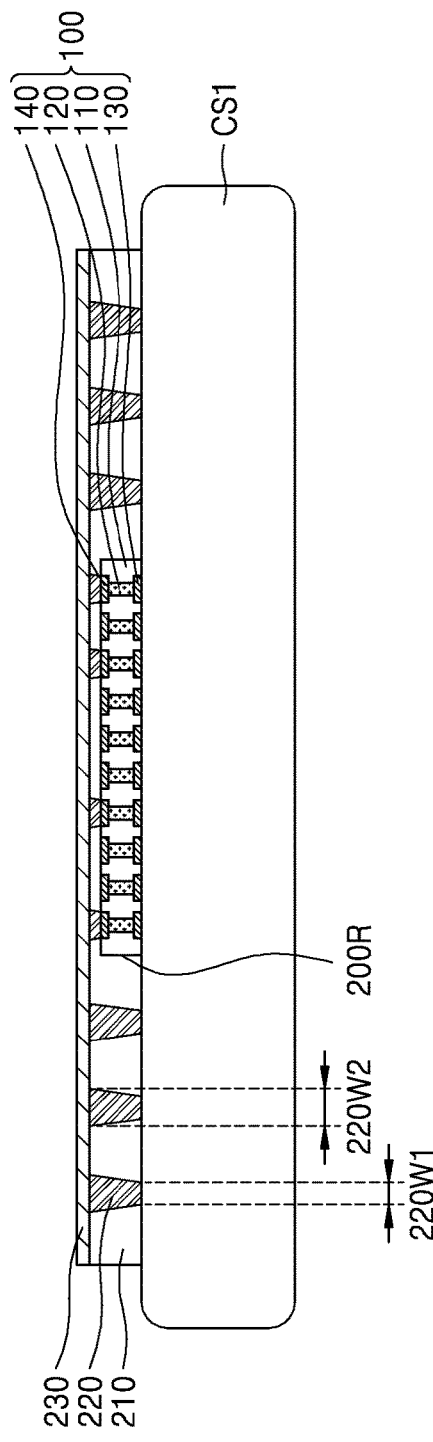

Referring to FIG. 7D, a vertical via 220, which includes a conductive material and is formed in a vertical via hole 210H (see FIG. 7C), may be formed. A redistribution layer 230 including a conductive material may be formed on the vertical via 220.

The vertical via 220 may be formed of or may include, for example, Cu, Ni, Au, Cr, Ti, or Pd, or may include an alloy thereof. The conductive material may be buried through various processes. For example, the conductive material may be buried through an electroplating process, an electroless plating process, a PVD process, and a CVD process. In some embodiments, the vertical via 220 may be formed through a plating process, and metal may be plated on a seed layer. The vertical via 220 and the seed layer may include the same metal, and for example, may each include Cu.

The vertical via 220 may include a tapered sidewall where a width 220W1 of an upper surface contacting the first carrier substrate CS1 is narrower than a width 220W2 of a lower surface contacting the redistribution layer 230. This is because the vertical via 220 is formed along a shape of the vertical via hole 210H formed through a dry etching process.

The redistribution layer 230 may be formed on the vertical via 220 and the interlayer insulation layer 210. The redistribution layer 230 may include the same metal as that of the vertical via 220. The redistribution layer 230 may be formed through an electroplating process.

Referring to FIG. 7E, a plurality of vertical vias 220 and redistribution layers 230 may include a plurality of layers, and an interlayer insulation layer 210 including a plurality of layers may be formed to cover the vertical vias 220 and the redistribution layers 230.

In some embodiments, the vertical vias 220 at a particular layer and each redistribution layer 230 may be respectively simultaneously formed through a damascene process or a dual damascene process. In other embodiments, the redistribution layers 230 may be formed through a lift-off process.

The interlayer insulation layer 210, as described above, may be formed of a photosensitive dielectric. The photosensitive dielectric may have a flat upper surface without reflecting a shape of a lower layer. Accordingly, the interlayer insulation layer 210 may have a flat profile regardless of a shape of the redistribution layer 230.

In other embodiments, as described above, the interlayer insulation layer 210 including a plurality of layers may include silicon oxide or silicon nitride. A silicon-group insulation layer may be good in insulation performance and may be formed by reflecting a shape of a lower layer. Therefore, the interlayer insulation layer 210 may include a concave-convex profile, based on a shape of the redistribution layer 230. However, for convenience of description, the interlayer insulation layer 210 is illustrated as a flat surface.

Referring to FIG. 7F, a pad insulation layer 240 and connection pads 250 may be formed on an interlayer insulation layer 210, and external interconnects 260 may be formed on the connection pads 250.

In some embodiments, each external interconnect 260 may be a conductive connection terminal formed of a solder ball. The solder ball may be formed in a spherical shape and may be attached on a respective connection pad 250. In other embodiments, the external interconnect 260 may be formed of a solder bump on the connection pad 250.

A side surface of each connection pad 250 may be covered by a pad insulation layer 240. In other embodiments, a side surface of each connection pad 250 may not be covered by the pad insulation layer 240. For example, the pad insulation layer 240 may be omitted.

Referring to FIG. 7G, a capping member CM which covers a pad insulation layer 240, connection pads 250, and external interconnects 260 may be attached on a second carrier substrate CS2 to be opposite to a first carrier substrate CS1.

In order to remove the first carrier substrate CS1 and perform a subsequent process, the second carrier substrate CS2 may be attached on the capping member CM. The second carrier substrate CS2 may include, for example, glass, Si, or aluminum oxide. In order to easily attach the second carrier substrate CS2 on the capping member CM, the capping member CM may have an adhesive force and may be an adhesive material.

In some embodiments, a coupling structure where the second carrier substrate CS2 is coupled to the capping member CM may be first prepared, and by applying pressure, the coupling structure may be attached on a portion where the pad insulation layer 240, the connection pads 250, and the external interconnects 260 are provided.

Referring to FIG. 7H, a laser beam may be irradiated onto a first carrier substrate CS1 (see FIG. 7G), for separating/removing the first carrier substrate CS1.

Due to irradiation of the laser beam, a coupling force between a laser reaction layer (not shown) and the first carrier substrate CS1 may be weakened. In some embodiments, the laser reaction layer may be removed by irradiating the laser beam. Subsequently, a remaining laser reaction layer may be removed by using an etchant. The remaining laser reaction layer may be removed through a wet etching process or a dry etching process.

The first carrier substrate CS1 may be removed, and then, in terms of a structure, an uppermost surface of a vertical via 220, an uppermost surface of an interlayer insulation layer 210, and an uppermost surface of an interposer 100 each exposed at an upper surface of a redistribution layer 200L may be substantially disposed on a coplanar surface.

After the first carrier substrate CS1 is removed, in order for the second carrier substrate CS2 to be disposed thereunder, the second carrier substrate CS2 may be reversed (e.g., flipped) and a subsequent process may be performed thereon.

Figure 7I:
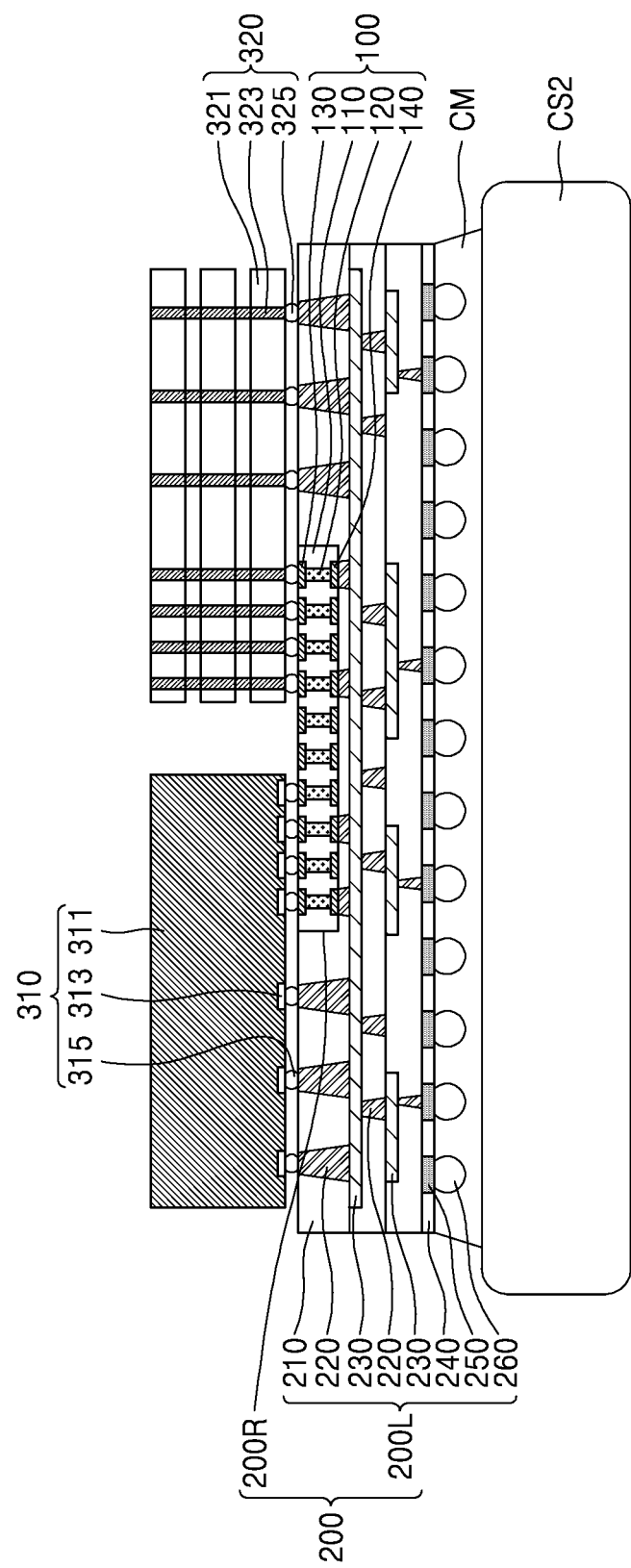

Referring to FIG. 7I, first and second interconnects 315 and 325 which are electrically connected to a vertical via 220 and an upper pad 130 of an interposer 100 each exposed at an upper surface of a redistribution region 200L may be formed, a first semiconductor chip 310 may be mounted on the first interconnect 315, and a second semiconductor chip 320 may be mounted on the second interconnect 325.

The first semiconductor chip 310 may include a first chip pad 313 as a conductive connection pad, and the second semiconductor chip 320 may include a second connection pad (not shown) as a conductive connection pad. Each of the first and second semiconductor chips 310 and 320 may include a semiconductor die which is individualized through a dicing process, or may include a sub-package which is manufactured by molding a semiconductor die. The first and second semiconductor chips 310 and 320 may respectively contact the first and second interconnects 315 and 325. In some embodiments, each of the first and second interconnects 315 and 325 may include a solder ball or solder bump.

Each of the first and second semiconductor chips 310 and 320 may be mounted so that an active surface thereof is disposed toward a downward portion and may be aligned to face an upper surface of a second carrier substrate CS2, but the arrangement is not limited thereto.

Figure 7J:
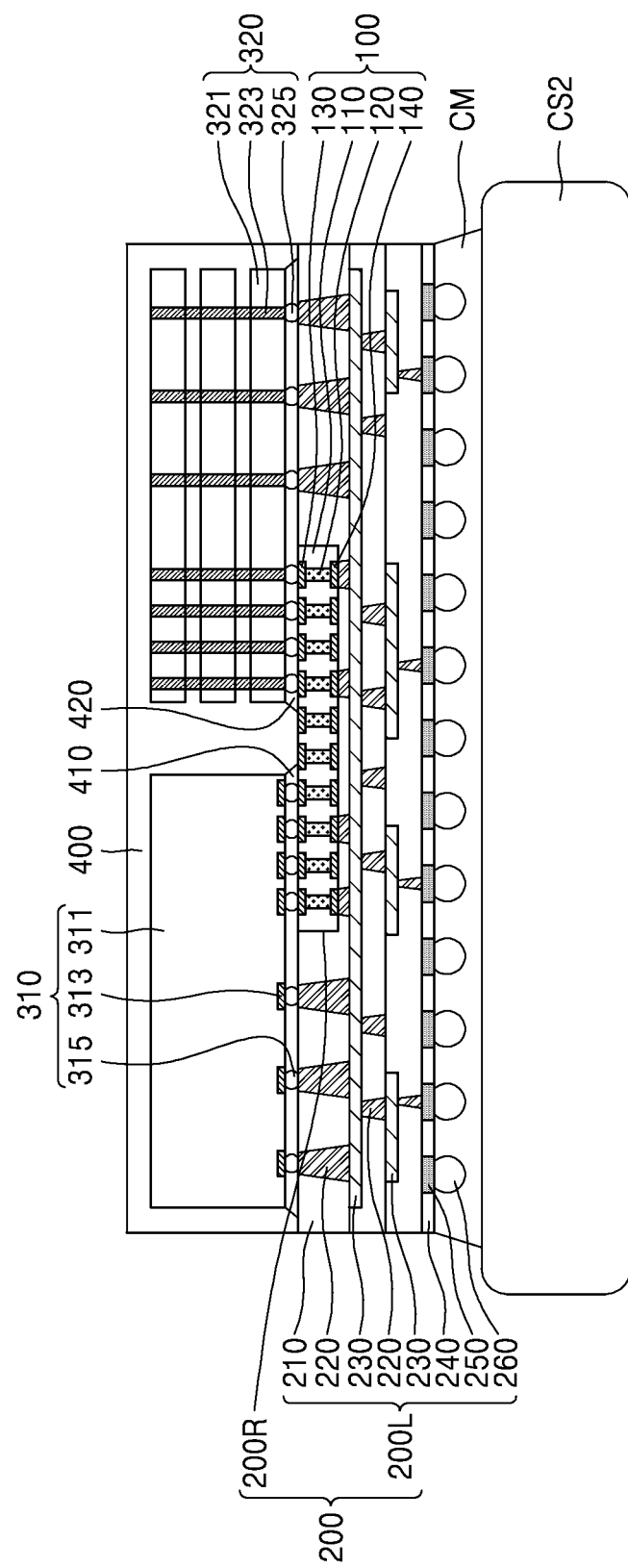

Referring to FIG. 7J, a molding part 400 surrounding side surfaces and upper surfaces of first and second semiconductor chips 310 and 320 may be formed.

The molding part 440, also described as an encapsulant or encapsulation layer, may protect the first and second semiconductor chips 310 and 320 from an external influence such as an impact. In order to perform such a function, the molding part 400 may include an epoxy mold compound (EMC), resin, or the like. Also, the molding part 400 may be formed through processes such as compression molding, lamination, and screen printing. In some embodiments, the molding part 400 may surround only the side surfaces of the first and second semiconductor chips 310 and 320 so as to externally expose the upper surfaces of the first and second semiconductor chips 310 and 320.

In a process of connecting first and second interconnects 315 and 325 to the first and second semiconductor chips 310 and 320, a gap may occur between the first and second interconnects 315 and 325 and the first and second semiconductor chips 310 and 320. The gap may cause a problem where the reliability of connections between the first and second interconnects 315 and 325 and the first and second semiconductor chips 310 and 320 is reduced, and thus, first and second under-fills 410 and 420 may be injected and cured for reinforcing a connection.

The first and second semiconductor chips 310 and 320 may be more stably fixed to the first and second interconnects 315 and 325 by the first and second under-fills 410 and 420, and despite a thermal expansion coefficient difference between the first and second interconnects 315 and 325 and the first and second semiconductor chips 310 and 320, in certain embodiments, the first and second interconnects 315 and 325 are not separated from the first and second semiconductor chips 310 and 320.

In some embodiments, the molding part 400 may be directly filled into the gap between the first and second interconnects 315 and 325 and the first and second semiconductor chips 310 and 320, and in this case, the first and second under-fills 410 and 420 may be omitted.

Referring again to FIG. 1A, the semiconductor package 10 according to an embodiment may be finished by removing the capping member CM and the second carrier substrate CS2.

In order to separate/remove the second carrier substrate CS2, a laser beam may be irradiated onto the second carrier substrate CS2.

Due to irradiation of the laser beam, a coupling force between the capping member CM and the second carrier substrate CS2 may be weakened. Subsequently, a remaining capping member CM may be removed by using an etchant.

Figure 8:
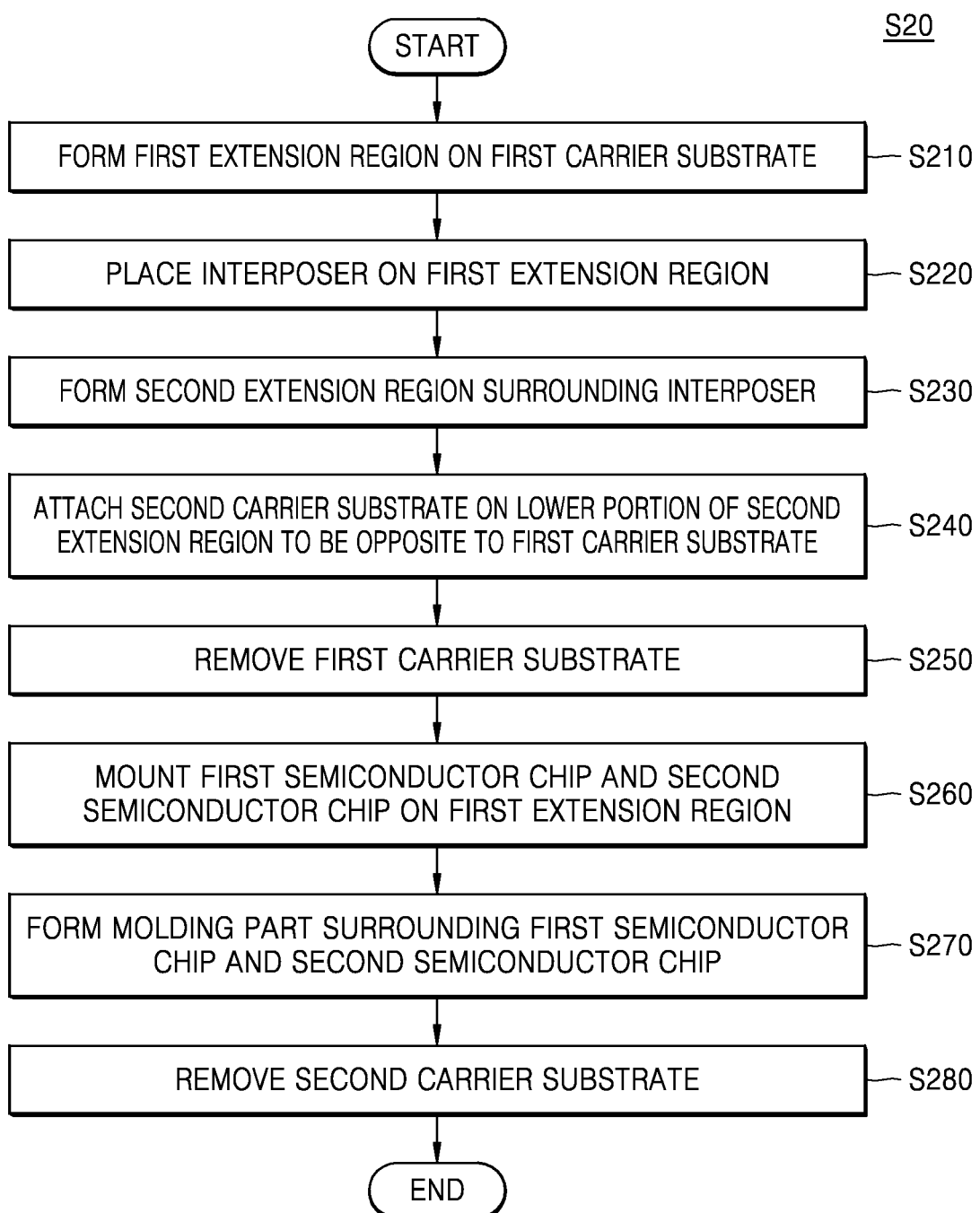
FIG. 8 is a flowchart illustrating a method of manufacturing a semiconductor package, according to another embodiment.

FIG. 8 is a flowchart illustrating a method S20 of manufacturing a semiconductor package, according to another embodiment.

Referring to FIG. 8, the method S20 of manufacturing the semiconductor package according to another embodiment may include all operations described above with reference to FIG. 6 and may include additional operations.

The method S20 of manufacturing the semiconductor package may include first operation S210 of forming a first extension region on a first carrier substrate, second operation S220 of placing an interposer on the first extension region, third operation S230 of forming a second extension region surrounding the interposer, fourth operation S240 of attaching a second carrier substrate on a lower portion of the second extension region to be opposite to the first carrier substrate, fifth operation S250 of removing the first carrier substrate, sixth operation S260 of mounting a first semiconductor chip and a second semiconductor chip on the first extension region, seventh operation S270 of forming a molding part surrounding the first semiconductor chip and the second semiconductor chip, and eighth operation S280 of removing the second carrier substrate.

Technical features of fourth to eighth operations S240 to S280 have been described in detail with reference to FIGS. 7A to 7J described above. Therefore, technical features of first to third operations S210 to S230 will be described in detail with reference to FIGS. 9A to 9C described below.

Figure 9C:
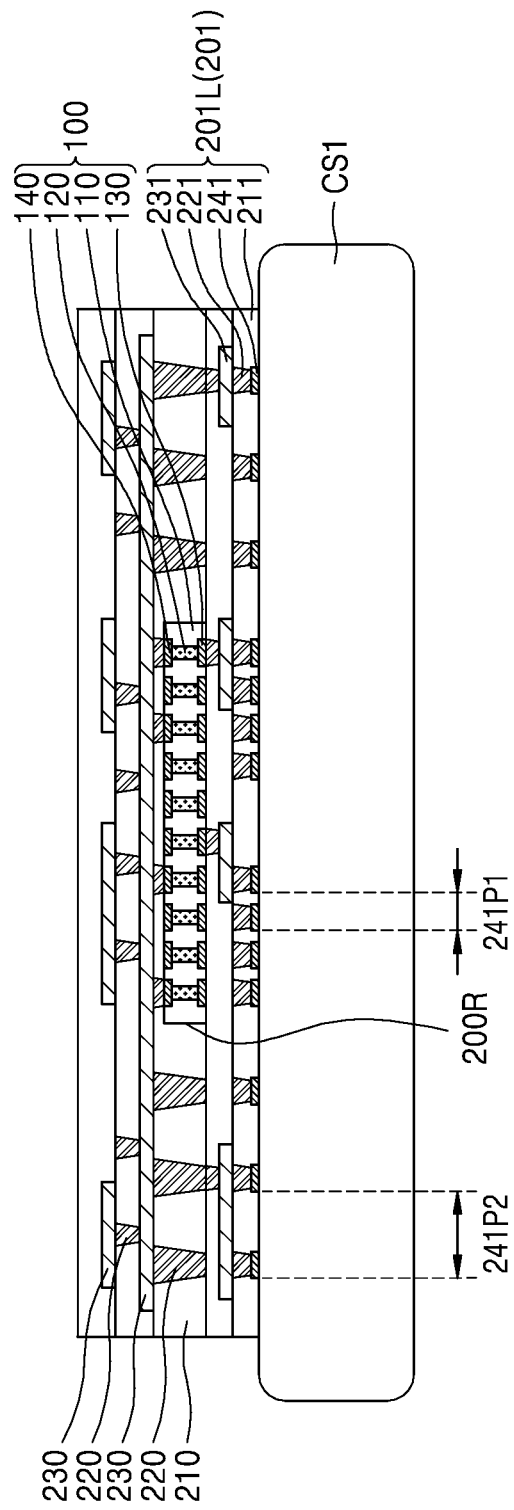

FIGS. 9A to 9C are cross-sectional views illustrating a method of manufacturing a semiconductor package in a process sequence, according to another embodiment.

Referring to FIG. 9A, before attaching an interposer 100 (see FIG. 9B), a first extension region 201 including a first redistribution region 201L may be formed on a first carrier substrate CS1.

The first redistribution region 201L may include a first interlayer insulation layer 211 including an insulating material, connection vias 221 including a conductive material, a first redistribution layer 231, and a connection pads 241. It should be noted that the various redistribution layers described herein (e.g., 230, 231) may include conductive wirings to electrically connect different conductive vias with each other. The conductive wirings may extend horizontally to connect to different vertical conductive vias.

The connection pads 241 may be formed to contact an upper surface of the first carrier substrate CS1. The connection pads 241 may be formed through a PVD process, a CVD process, and/or the like. A region where the connection pads 241 are provided may be divided into a first region AR1 where a plurality of connection pads 241 are arranged at a first minimum pitch 241P1 and a second region AR2 where a plurality of connection pads 241 are arranged at a second minimum pitch 241P2, which is greater than the first minimum pitch 241P1. The first region AR1 may be a region where the interposer 100 is disposed.

The connection vias 221 may connect one first redistribution layer 231 to another first redistribution layer 231, or may connect the connection pads 241 to the first redistribution layer 231. The connection vias 221 may be formed through a plating process, and metal may be plated on a seed layer.

The first redistribution layers 231 may be electrically connected to the connection vias 221. The first redistribution layers 231 may include the same metal as that of the connection vias 221. In some embodiments, a layer of the connection vias 221 and one of the first redistribution layers 231 may be simultaneously formed through a damascene process or a dual damascene process. In other embodiments, the first redistribution layers 231 may be formed through a lift-off process.

The first interlayer insulation layer 211 may include silicon oxide, silicon nitride, or a photosensitive dielectric. The first interlayer insulation layer 211 may expose a portion of the connection vias 221 and/or a portion of the first redistribution layers 231.

Referring to FIG. 9B, an interposer 100 including through electrodes 120 may be disposed in a first extension region 201.

A region where connection pads 241 are provided may be divided into a first region AR1 where a plurality of connection pads 241 are arranged at a first minimum pitch 241P1 and a second region AR2 where a plurality of connection pads 241 are arranged at a second minimum pitch 241P2, which is greater than the first minimum pitch 241P1. The interposer 100 may be disposed in the first region AR1.

The connection pads 241 of the first region AR1 may be electrically connected to the through electrodes 120 of the interposer 100 through a first redistribution layer 231, and the connection pads 241 of the second region AR2 may be electrically connected to a second redistribution layer 230 (see FIG. 9C) through the first redistribution layer 231.

Referring to FIG. 9C, a second extension region 200 including a second redistribution region 200L and a recess region 200R may be formed to cover a first extension region 200 and an interposer 100.

In the second extension region 200, the plurality of a vertical vias 220 and redistribution layers 230 may be formed of a plurality of layers, and an interlayer insulation layer 210 configured with a plurality of layers may be formed to cover the vertical vias 220 and the redistribution layers 230.

The interposer 100 may be disposed on a first carrier substrate CS1 and may be surrounded by the first extension region 201 and the second extension region 200.

Subsequently, the semiconductor package 20 according to the present embodiment may be finished by performing a subsequent process which is substantially the same process as the process described above with reference to FIGS. 7F to 7J.

Figure 10:
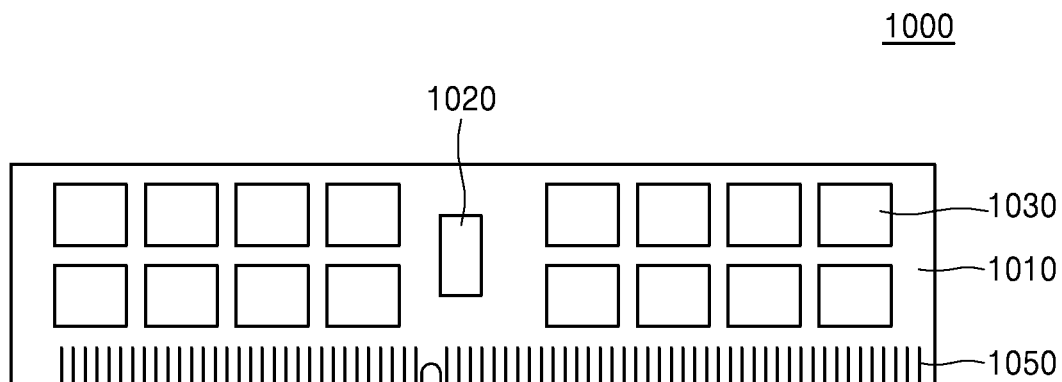
FIG. 10 is a plan view illustrating a semiconductor module including a semiconductor package according to an embodiment.

FIG. 10 is a plan view illustrating a semiconductor module 1000 including a semiconductor package according to an embodiment.

Referring to FIG. 10, the semiconductor module 1000 may include a module substrate 1010, a control chip 1020 mounted on the module substrate 1010, and a plurality of semiconductor packages 1030 mounted on the module substrate 1010.

A plurality of input/output (I/O) terminals 1050 capable of being inserted into a socket of a main board may be disposed on one side of the module substrate 1010. The plurality of semiconductor packages 1030 may include one of the semiconductor packages 10, 20, 30, 40, and 50 described above with reference to FIGS. 1A to 5B.

Figure 11:
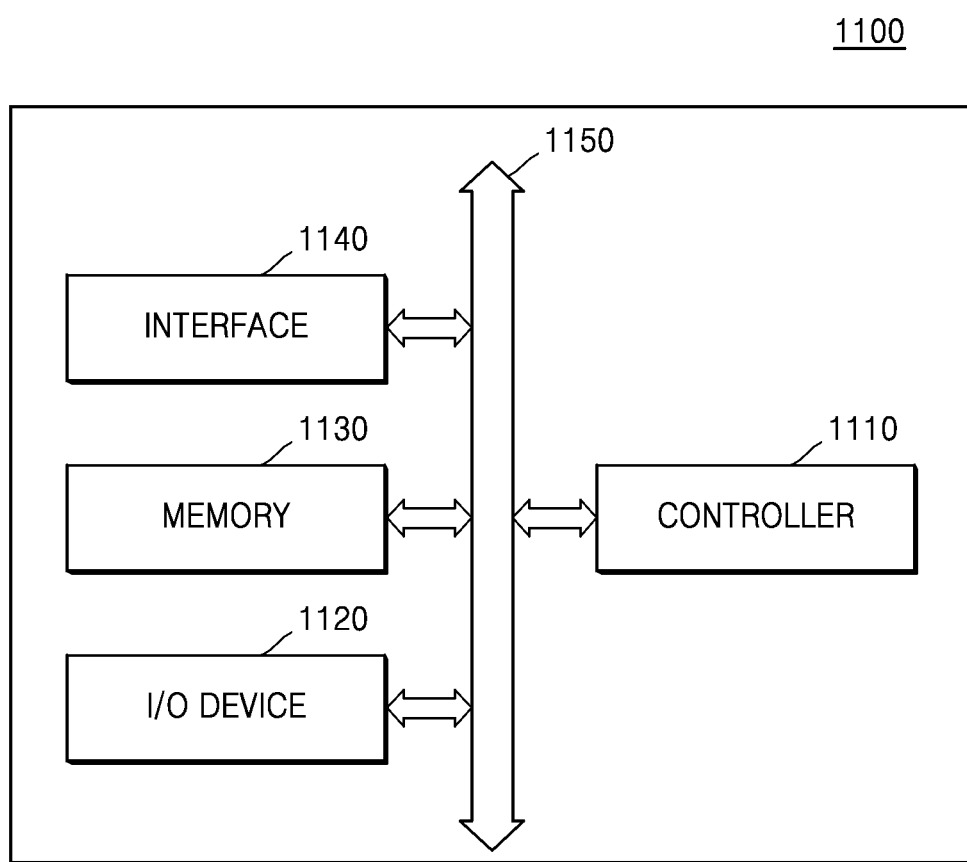
FIG. 11 is a block diagram illustrating a system of a semiconductor package according to an embodiment.

FIG. 11 is a block diagram illustrating a system 1100 including a semiconductor package according to an embodiment.

Referring to FIG. 11, the system 1100 may include a controller 1110, an I/O device 1120, a memory 130, an interface 1140, and a bus 1150.

The system 1100 may be a mobile system or a system which transmits or receives information. In some embodiments, the mobile system may be a portable computer, a web tablet, a mobile phone, a digital music player, a memory card, or the like.

The controller 1100 may control a program executed in the system 1100 and may include a microprocessor, a digital signal processor, a microcontroller, or a device similar thereto.

The I/O device 1120 may be used to input or output data of the system 1100. The system 1100 may be connected to an external device (for example, a personal computer or a network) by using the I/O device 1120 and may exchange data with the external device. The I/O device 1120 may be, for example, a touch pad, a keyboard, a display, or the like.

The memory 1130 may store data for an operation of the controller 1110, or may store data obtained through processing by the controller 1110. The memory 1130 may include one of the semiconductor packages 10, 20, 30, 40, and 50 described above with reference to FIGS. 1A to 5B.

The interface 1140 may be a data transmission path between the system 1100 and the external device. The controller 1110, the I/O device 1120, the memory 130, and the interface 1140 may communicate with one another through the bus 1150.

While the inventive concept has been particularly shown and described with reference to embodiments thereof, it will be understood that various changes in form and details may be made therein without departing from the spirit and scope of the following claims.

What is claimed is:

1. A semiconductor package comprising:
    a redistribution region including:
        a plurality of interlayer insulating layers and a first redistribution layer provided at an interface between a first interlayer insulating layer and a second interlayer insulating layer of the plurality of interlayer insulating layers,
        a third interlayer insulating layer below the first and second interlayer insulating layers, and a second redistribution layer provided at an interface between the second interlayer insulating layer and the third interlayer insulating layer,
        a plurality of first vertical conductive vias formed within the redistribution region and having bottom surfaces connected to the first redistribution layer, and a plurality of second vertical conductive vias formed within the redistribution region and having bottom surfaces connected to the second redistribution layer, and
        a recess region recessed from an upper surface of the redistribution region and above the first redistribution layer;
    an interposer in the recess region, the interposer comprising a substrate, a plurality of upper pads disposed at an upper surface of the substrate, and a plurality of through electrodes passing through the substrate and respectively connected to the plurality of upper pads; and
    a first semiconductor chip and a second semiconductor chip each including a plurality of conductive interconnection terminals respectively connected to the plurality of upper pads and the first vertical conductive vias exposed at the upper surface of the redistribution region, the first semiconductor chip and the second semiconductor chip being mounted on the redistribution region and the interposer and disposed horizontally apart from each other,
    wherein, in a plan view, the interposer is disposed to overlap a portion of each of the first semiconductor chip and the second semiconductor chip,
    wherein the first and second vertical conductive vias each have a tapered shape with a width thereof progressively increasing in a direction away from the first semiconductor chip and the second semiconductor chip, and
    wherein a thickness of the first vertical conductive vias is greater than a thickness of the interposer.

2. The semiconductor package of claim 1, wherein a minimum pitch of the upper pads is less than a minimum pitch of the first vertical conductive vias exposed at the upper surface of the redistribution region.

3. The semiconductor package of claim 1, wherein the interposer comprises a wafer substrate, and the through electrodes pass through the wafer substrate and are directly connected to the first vertical conductive vias that are directly connected to the first redistribution layer that is disposed under the interposer.

4. The semiconductor package of claim 1, wherein the first semiconductor chip comprises a single logic chip, and the second semiconductor chip comprises a memory chip set configured to enable pieces of data to be merged between memory chips of the memory chip set.

5. The semiconductor package of claim 4, wherein the first semiconductor chip and the second semiconductor chip each transmit a data signal therebetween through the interposer, and each of the first semiconductor chip and the second semiconductor chip is grounded or receives power through a set of the first vertical conductive vias and the first redistribution layer.

6. The semiconductor package of claim 1, wherein the first interlayer insulating layer surrounds the first redistribution layer and the plurality of the first vertical conductive vias.

7. The semiconductor package of claim 6, wherein an uppermost surface of the first vertical conductive vias is exposed at the upper surface of the redistribution region, an uppermost surface of the first interlayer insulation layer, and an uppermost surface of the interposer are coplanar.

8. The semiconductor package of claim 1, further comprising:
    a molding part surrounding at least a side surface of each of the first semiconductor chip and the second semiconductor chip,
    wherein a side surface of the first interlayer insulation layer and a side surface of the molding part are coplanar.

9. A semiconductor package comprising:
    a redistribution region including:
        a plurality of interlayer insulating layers and a first redistribution layer provided at an interface between a first interlayer insulating layer and a second interlayer insulating layer of the plurality of interlayer insulating layers,
        a third interlayer insulating layer below the first and second interlayer insulating layers, and a second redistribution layer provided at an interface between the second interlayer insulating layer and the third interlayer insulating layer, a plurality of first vertical conductive vias formed within the redistribution region and having bottom surfaces connected to the first redistribution layer, and a plurality of second vertical conductive vias formed within the redistribution region and having bottom surfaces connected to the second redistribution layer, and a recess region recessed from an upper surface of the redistribution region and above the first redistribution layer;

an interposer in the recess region, the interposer comprising a substrate, a plurality of upper pads disposed at an upper surface of the substrate, and a plurality of through electrodes passing through the substrate and respectively connected to the plurality of upper pads; and a first semiconductor chip and a second semiconductor chip each including a plurality of conductive interconnection terminals respectively connected to the plurality of upper pads and the first vertical conductive vias exposed at the upper surface of the redistribution region, the first semiconductor chip and the second semiconductor chip being mounted on the redistribution region and the interposer and disposed horizontally apart from each other, wherein, in a plan view, the interposer is disposed to overlap a portion of each of the first semiconductor chip and the second semiconductor chip, wherein a minimum pitch of the upper pads is less than a minimum pitch of the first vertical conductive vias exposed at the upper surface of the redistribution region, and wherein a top surface of the interposer and a top surface of the first interlayer insulating layer are coplanar.

10. The semiconductor package of claim 9, wherein the first and second vertical conductive vias each have a tapered shape with a width thereof progressively increasing in a direction away from the first semiconductor chip and the second semiconductor chip.

11. The semiconductor package of claim 9, wherein the interposer comprises a wafer substrate, and the through electrodes pass through the wafer substrate and are directly connected to the first vertical conductive vias that are directly connected to the first redistribution layer that is disposed under the interposer.

12. The semiconductor package of claim 9, wherein the first semiconductor chip comprises a single logic chip, and the second semiconductor chip comprises a memory chip set configured to enable pieces of data to be merged between memory chips of the memory chip set.

13. The semiconductor package of claim 12, wherein the first semiconductor chip and the second semiconductor chip each transmit a data signal therebetween through the interposer, and each of the first semiconductor chip and the second semiconductor chip is grounded or receives power through a set of the first vertical conductive vias and the first redistribution layer.

14. The semiconductor package of claim 9, wherein the first interlayer insulating layer surrounds the first redistribution layer and the plurality of the first vertical conductive vias, the semiconductor package further comprising:

a molding part surrounding at least a side surface of each of the first semiconductor chip and the second semiconductor chip, wherein a side surface of the first interlayer insulation layer and a side surface of the molding part are coplanar.

15. A semiconductor package comprising:
a redistribution region including:
a plurality of interlayer insulating layers and a first redistribution layer provided at an interface between a first interlayer insulating layer and a second interlayer insulating layer of the plurality of interlayer insulating layers, a third interlayer insulating layer below the first and second interlayer insulating layers, and a second redistribution layer provided at an interface between the second interlayer insulating layer and the third interlayer insulating layer, a plurality of first vertical conductive vias formed within the redistribution region and having bottom surfaces connected to the first redistribution layer, and a plurality of second vertical conductive vias formed within the redistribution region and having bottom surfaces connected to the second redistribution layer, and a plurality of recess regions recessed from an upper surface of the redistribution region and above the first redistribution layer;

a plurality of interposers in the plurality of recess regions, respectively, the plurality of interposers each comprising a substrate, a plurality of upper pads disposed at an upper surface of the substrate, and a plurality of through electrodes respectively connected to the plurality of upper pads to pass through the substrate; and a plurality of semiconductor chips each comprising a plurality of respective interconnection terminals connected to the plurality of upper pads and the plurality of first vertical conductive vias exposed at the upper surface of the redistribution region, the plurality of semiconductor chips being mounted on the extension region and the plurality of interposers and disposed horizontally spaced apart from one another, wherein, in a plan view, each of the plurality of interposers is disposed to overlap a portion of each of at least two of the plurality of semiconductor chips.

16. The semiconductor package of claim 15, wherein a thickness of the first vertical conductive vias is greater than a thickness of the interposers.

17. The semiconductor package of claim 15, wherein a minimum pitch of the upper pads is less than a minimum pitch of the first vertical conductive vias exposed at the upper surface of the redistribution region.

18. The semiconductor package of claim 15, wherein the first and second vertical conductive vias have a tapered shape with a width thereof progressively increasing in a direction away from the plurality of semiconductor chips.

19. The semiconductor package of claim 15, wherein one of the plurality of the semiconductor chips comprises a single logic chip, and the others of the plurality of the semiconductor chips comprise a memory chip set configured to enable pieces of data to be merged between memory chips of the memory chip set.

20. The semiconductor package of claim 19, wherein the plurality of the semiconductor chips each transmit a data signal therebetween through the plurality of the interposers, and each of the plurality of the semiconductor chips is grounded or receives power through a set of the first vertical conductive vias and the first redistribution layer.

\* \* \* \* \*